US006991953B1

(12) United States Patent  
Bruner et al.

(10) Patent No.: US 6,991,953 B1  
(45) Date of Patent: Jan. 31, 2006

(54) MICROELECTRONIC MECHANICAL SYSTEM AND METHODS

(75) Inventors: Mike Bruner, Saratoga, CA (US); Richard Yeh, Fremont, CA (US); Jim Hunter, Campbell, CA (US)

(73) Assignee: Silicon Light Machines Corporation, Sunnyvale, CA (US)

( * ) Notice: Subject to any disclaimer, the term of this patent is extended or adjusted under 35 U.S.C. 154(b) by 191 days.

(21) Appl. No.: 10/112,962

(22) Filed: Mar. 28, 2002

Related U.S. Application Data

(63) Continuation-in-part of application No. 09/952,626, filed on Sep. 13, 2001.

(51) Int. Cl.
*H01L 21/308* (2006.01)
*H01L 21/469* (2006.01)

(52) U.S. Cl. .................. 438/29; 438/32; 438/737; 438/738; 438/739; 438/740

(58) Field of Classification Search ............... 483/29, 483/32, 735, 737, 738, 739; 438/740, 29, 438/32, 737, 739, 735, 738; 257/680; 216/2, 216/99
See application file for complete search history.

(56) References Cited

U.S. PATENT DOCUMENTS

| | | |
|---|---|---|
| 1,525,550 A | 2/1925 | Jenkins |
| 1,548,262 A | 8/1925 | Freedman |
| 1,814,701 A | 7/1931 | Ives |
| 2,415,226 A | 2/1947 | Szikiai ................. 178/5.4 |
| 2,783,406 A | 2/1957 | Vanderhooft .............. 313/70 |
| 2,920,529 A | 1/1960 | Blythe ..................... 88/73 |
| 2,991,690 A | 7/1961 | Grey et al. ............... 88/16.6 |
| 3,256,465 A | 6/1966 | Weissenstern et al. ...... 317/101 |
| 3,388,301 A | 6/1968 | James ..................... 317/234 |
| 3,443,871 A | 5/1969 | Chitayat .................. 356/106 |
| 3,553,364 A | 1/1971 | Lee ....................... 178/7.3 |
| 3,576,394 A | 4/1971 | Lee ....................... 178/7.3 |
| 3,600,798 A | 8/1971 | Lee ....................... 29/592 |
| 3,656,837 A | 4/1972 | Sandbank ................. 350/161 |

(Continued)

FOREIGN PATENT DOCUMENTS

EP 0 878 824 A2 * 11/1998

(Continued)

OTHER PUBLICATIONS

Chan et al., Gas Phase Pulse Etching of Silicon for MEMS With Xenon Difluoride, 1999 IEEE Canadian Conference on Electrical and Computer Engineering, pp. 1637-1642.*

(Continued)

*Primary Examiner*—M. Wilczewski
(74) *Attorney, Agent, or Firm*—Okamoto & Benedicto LLP

(57) ABSTRACT

The current invention provides for encapsulated release structures, intermediates thereof and methods for their fabrication. A multi-layer structure has a capping layer, that preferably comprises silicon oxide and/or silicon nitride, and which is formed over an etch resistant substrate. A patterned device layer, preferably comprising silicon nitride, is embedded in a sacrificial material, preferably comprising poly-silicon, and is disposed between the etch resistant substrate and the capping layer. Access trenches or holes are formed in to capping layer and the sacrificial material is selectively etched through the access trenches, such that portions of the device layer are release from sacrificial material. The etchant preferably comprises a noble gas fluoride $NGF_{2x}$, (wherein NG=Xe, Kr or Ar: and where x=1, 2 or 3). After etching that sacrificial material, the access trenches are sealed to encapsulate released portions the device layer between the etch resistant substrate and the capping layer. The current invention is particularly useful for fabricating MEMS devices, multiple cavity devices and devices with multiple release features.

15 Claims, 11 Drawing Sheets

U.S. PATENT DOCUMENTS

| | | | |
|---|---|---|---|
| 3,657,610 A | 4/1972 | Yamamoto et al. | 317/243 |
| 3,693,239 A | 9/1972 | Dix | 29/470 |
| 3,743,507 A | 7/1973 | Ih et al. | 96/81 |
| 3,752,563 A | 8/1973 | Torok et al. | 350/151 |
| 3,781,465 A | 12/1973 | Ernstoff et al. | 178/5.4 BD |
| 3,783,184 A | 1/1974 | Ernstoff et al. | 178/5.4 BD |
| 3,792,916 A | 2/1974 | Sarna | 350/163 |
| 3,802,769 A | 4/1974 | Rotz et al. | 352/43 |
| 3,811,186 A | 5/1974 | Larnerd et al. | 29/626 |
| 3,861,784 A | 1/1975 | Torok | 350/162 R |
| 3,862,360 A | 1/1975 | Dill et al. | 178/7.3 D |
| 3,871,014 A | 3/1975 | King et al. | 357/67 |
| 3,886,310 A | 5/1975 | Guldberg et al. | 178/7.5 D |
| 3,896,338 A | 7/1975 | Nathanson et al. | 315/373 |
| 3,915,548 A | 10/1975 | Opittek | 350/3.5 |
| 3,935,499 A | 1/1976 | Oess | 313/413 |
| 3,935,500 A | 1/1976 | Oess et al. | 313/495 |
| 3,938,881 A | 2/1976 | Biegelsen et al. | 350/161 |
| 3,941,456 A | 3/1976 | Schilz et al. | 350/161 |
| 3,942,245 A | 3/1976 | Jackson et al. | 29/591 |
| 3,943,281 A | 3/1976 | Keller et al. | 178/7.5 D |
| 3,947,105 A | 3/1976 | Smith | 353/121 |
| 3,969,611 A | 7/1976 | Fonteneau | 219/502 |
| 3,980,476 A | 9/1976 | Wysocki | 96/1.1 |
| 3,991,416 A | 11/1976 | Byles et al. | 340/324 R |
| 4,001,663 A | 1/1977 | Bray | 321/2 |
| 4,004,849 A | 1/1977 | Shattuck | 350/160 R |
| 4,006,968 A | 2/1977 | Ernstoff et al. | 350/160 LC |
| 4,009,939 A | 3/1977 | Okano | 350/162 SF |
| 4,011,009 A | 3/1977 | Lama et al. | 350/162 R |
| 4,012,116 A | 3/1977 | Yevick | 350/132 |
| 4,012,835 A | 3/1977 | Wallick | 29/591 |
| 4,017,158 A | 4/1977 | Booth | 350/162 SF |
| 4,020,381 A | 4/1977 | Oess et al. | 313/302 |
| 4,021,766 A | 5/1977 | Aine | 338/2 |
| 4,034,211 A | 7/1977 | Horst et al. | 235/61.12 N |
| 4,034,399 A | 7/1977 | Drukier et al. | 357/68 |
| 4,035,068 A | 7/1977 | Rawson | 353/122 |
| 4,067,129 A | 1/1978 | Abramson et al. | 40/563 |
| 4,084,437 A | 4/1978 | Finnegan | 73/361 |
| 4,090,219 A | 5/1978 | Ernstoff et al. | 358/59 |
| 4,093,346 A | 6/1978 | Nishino et al. | 350/162 SF |
| 4,093,921 A | 6/1978 | Buss | 325/459 |
| 4,093,922 A | 6/1978 | Buss | 325/459 |
| 4,100,579 A | 7/1978 | Ernstoff | 358/230 |
| 4,103,273 A | 7/1978 | Keller | 338/2 |
| 4,126,380 A | 11/1978 | Borm | 350/266 |
| 4,127,322 A | 11/1978 | Jacobson et al. | 353/31 |
| 4,135,502 A | 1/1979 | Peck | 128/76.5 |
| 4,139,257 A | 2/1979 | Matsumoto | 350/6.1 |
| 4,143,943 A | 3/1979 | Rawson | 350/120 |
| 4,163,570 A | 8/1979 | Greenaway | 283/8 A |
| 4,184,700 A | 1/1980 | Greenaway | 283/6 |
| 4,185,891 A | 1/1980 | Kaestner | 350/167 |
| 4,190,855 A | 2/1980 | Inoue | 357/80 |
| 4,195,915 A | 4/1980 | Lichty et al. | 350/345 |
| 4,205,428 A | 6/1980 | Ernstoff et al. | 29/592 R |
| 4,211,918 A | 7/1980 | Nyfeler et al. | 235/454 |
| 4,223,050 A | 9/1980 | Nyfeler et al. | 427/163 |
| 4,225,913 A | 9/1980 | Bray | 363/97 |
| 4,249,796 A | 2/1981 | Sincerbox et al. | 350/370 |
| 4,250,217 A | 2/1981 | Greenaway | 428/161 |
| 4,250,393 A | 2/1981 | Greenaway | 250/566 |
| 4,256,787 A | 3/1981 | Shaver et al. | 428/1 |
| 4,257,016 A | 3/1981 | Kramer, Jr. et al. | 322/7.51 |
| 4,290,672 A | 9/1981 | Whitefield | 350/358 |
| 4,295,145 A | 10/1981 | Latta | 346/108 |
| 4,311,999 A | 1/1982 | Upton et al. | 340/755 |
| 4,327,411 A | 4/1982 | Turner | 364/900 |
| 4,327,966 A | 5/1982 | Bloom | 350/162 R |
| 4,331,972 A | 5/1982 | Rajchman | 358/60 |
| 4,336,982 A | 6/1982 | Rector, Jr. | 350/358 |
| 4,338,660 A | 7/1982 | Kelley et al. | 364/200 |
| 4,343,535 A | 8/1982 | Bleha, Jr. | 350/342 |
| 4,346,965 A | 8/1982 | Sprague et al. | 350/358 |
| 4,348,079 A | 9/1982 | Johnson | 350/358 |
| 4,355,463 A | 10/1982 | Burns | 29/827 |
| 4,361,384 A | 11/1982 | Bosserman | 350/174 |
| 4,369,524 A | 1/1983 | Rawson et al. | 455/606 |
| 4,374,397 A | 2/1983 | Mir | 358/75 |
| 4,389,096 A | 6/1983 | Hori et al. | 350/339 R |
| 4,391,490 A | 7/1983 | Hartke | 350/356 |
| 4,396,246 A | 8/1983 | Holman | 350/96.14 |
| 4,398,798 A | 8/1983 | Krawczak et al. | 350/162.24 |
| 4,400,740 A | 8/1983 | Traino et al. | 358/293 |
| 4,408,884 A | 10/1983 | Kleinknecht et al. | 356/355 |
| 4,414,583 A | 11/1983 | Hooker, III | 358/300 |
| 4,417,386 A | 11/1983 | Exner | 29/590 |
| 4,418,397 A | 11/1983 | Brantingham et al. | 364/900 |
| 4,420,717 A | 12/1983 | Wallace et al. | 318/696 |
| 4,422,099 A | 12/1983 | Wolfe | 358/293 |
| 4,426,768 A | 1/1984 | Black et al. | 29/583 |
| 4,430,584 A | 2/1984 | Someshwar et al. | 307/465 |
| 4,435,041 A | 3/1984 | Torok et al. | 350/162.24 |
| 4,440,839 A | 4/1984 | Mottier | 430/2 |
| 4,443,819 A | 4/1984 | Funada et al. | 358/236 |
| 4,443,845 A | 4/1984 | Hamilton et al. | 364/200 |
| 4,447,881 A | 5/1984 | Brantingham et al. | 364/488 |
| 4,454,591 A | 6/1984 | Lou | 364/900 |
| 4,456,338 A | 6/1984 | Gelbart | 350/358 |
| 4,460,907 A | 7/1984 | Nelson | 346/153.1 |
| 4,462,046 A | 7/1984 | Spight | 358/101 |
| 4,467,342 A | 8/1984 | Tower | 357/30 |
| 4,468,725 A | 8/1984 | Venturini | 363/160 |
| 4,483,596 A | 11/1984 | Marshall | 350/385 |
| 4,484,188 A | 11/1984 | Ott | 340/728 |
| 4,492,435 A | 1/1985 | Banton et al. | 350/360 |
| 4,503,494 A | 3/1985 | Hamilton et al. | 364/200 |
| 4,511,220 A | 4/1985 | Scully | 350/403 |
| 4,538,883 A | 9/1985 | Sprague et al. | 350/356 |
| 4,545,610 A | 10/1985 | Lakritz et al. | 29/589 |
| 4,556,378 A | 12/1985 | Nyfeler et al. | 425/143 |
| 4,558,171 A | 12/1985 | Gantley et al. | 174/52 FP |
| 4,561,044 A | 12/1985 | Ogura et al. | 382/84 |
| 4,566,935 A | 1/1986 | Hornbeck | 156/626 |
| 4,567,585 A | 1/1986 | Gelbart | 369/97 |
| 4,571,041 A | 2/1986 | Gaudyn | 353/10 |
| 4,571,603 A | 2/1986 | Hornbeck et al. | 346/160 |
| 4,577,932 A | 3/1986 | Gelbart | 350/358 |
| 4,577,933 A | 3/1986 | Yip et al. | 350/358 |
| 4,588,957 A | 5/1986 | Balant et al. | 330/4.3 |
| 4,590,548 A | 5/1986 | Maytum | 363/161 |
| 4,594,501 A | 6/1986 | Culley et al. | 219/492 |
| 4,596,992 A | 6/1986 | Hornbeck | 346/76 PH |
| 4,615,595 A | 10/1986 | Hornbeck | 353/122 |
| 4,623,219 A | 11/1986 | Trias | 350/351 |
| 4,636,039 A | 1/1987 | Turner | 350/356 |
| 4,636,866 A | 1/1987 | Hattori | 358/236 |
| 4,641,193 A | 2/1987 | Glenn | 358/233 |
| 4,645,881 A | 2/1987 | LeToumelin et al. | 379/252 |
| 4,646,158 A | 2/1987 | Ohno et al. | 358/236 |
| 4,649,085 A | 3/1987 | Landram | 428/620 |
| 4,649,432 A | 3/1987 | Watanabe | 358/241 |
| 4,652,932 A | 3/1987 | Miyajima et al. | 358/236 |
| 4,655,539 A | 4/1987 | Caulfield et al. | 350/3.6 |
| 4,660,938 A | 4/1987 | Kazan | 350/355 |
| 4,661,828 A | 4/1987 | Miller, Jr. et al. | 346/108 |
| 4,662,746 A | 5/1987 | Hornbeck | 350/269 |
| 4,663,670 A | 5/1987 | Ito et al. | 358/245 |
| 4,687,326 A | 8/1987 | Corby, Jr. | 356/5 |
| 4,698,602 A | 10/1987 | Armitage | 332/7.51 |
| 4,700,276 A | 10/1987 | Freyman et al. | 361/403 |
| 4,707,064 A | 11/1987 | Dobrowolski et al. | 350/96.19 |
| 4,709,995 A | 12/1987 | Kuribayashi et al. | 350/350 |

| | | | |
|---|---|---|---|
| 4,710,732 A | 12/1987 | Hornbeck .................. 332/7.51 |
| 4,711,526 A | 12/1987 | Hennings et al. ........... 350/170 |
| 4,714,326 A | 12/1987 | Usui et al. .................. 350/485 |
| 4,717,066 A | 1/1988 | Goldenberg et al. ........ 228/179 |
| 4,719,507 A | 1/1988 | Bos .............................. 358/92 |
| 4,721,629 A | 1/1988 | Sakai et al. .................. 427/35 |
| 4,722,593 A | 2/1988 | Shimazaki .................. 350/336 |
| 4,724,467 A | 2/1988 | Yip et al. ...................... 355/71 |
| 4,728,185 A | 3/1988 | Thomas ...................... 353/122 |
| 4,743,091 A | 5/1988 | Gelbart ....................... 350/252 |
| 4,744,633 A | 5/1988 | Sheiman ..................... 350/132 |
| 4,747,671 A | 5/1988 | Takahashi et al. .......... 350/336 |
| 4,751,509 A | 6/1988 | Kubota et al. ............... 340/784 |
| 4,761,253 A | 8/1988 | Antes .......................... 264/1.3 |
| 4,763,975 A | 8/1988 | Scifres et al. ............. 350/96.15 |
| 4,772,094 A | 9/1988 | Sheiman ..................... 350/133 |
| 4,797,694 A | 1/1989 | Agostinelli et al. ......... 346/160 |
| 4,797,918 A | 1/1989 | Lee et al. ...................... 380/20 |
| 4,801,194 A | 1/1989 | Agostinelli et al. ......... 350/356 |
| 4,803,560 A | 2/1989 | Matsunaga et al. ......... 359/236 |
| 4,804,641 A | 2/1989 | Arlt et al. .................... 437/227 |
| 4,807,021 A | 2/1989 | Okumura ...................... 357/75 |
| 4,807,965 A | 2/1989 | Garakani .................... 350/131 |
| 4,809,078 A | 2/1989 | Yabe et al. .................. 358/236 |
| 4,811,082 A | 3/1989 | Jacobs et al. ................. 357/80 |
| 4,811,210 A | 3/1989 | McAulay .................... 364/200 |
| 4,814,759 A | 3/1989 | Gombrich et al. .......... 340/771 |
| 4,817,850 A | 4/1989 | Wiener-Avnear et al. ... 228/119 |
| 4,824,200 A | 4/1989 | Isono et al. ............... 350/96.16 |
| 4,827,391 A | 5/1989 | Sills ............................. 363/41 |
| 4,829,365 A | 5/1989 | Eichenlaub ..................... 358/3 |
| 4,836,649 A | 6/1989 | Ledebuhr et al. ........ 350/331 R |
| 4,856,863 A | 8/1989 | Sampsell et al. ......... 350/96.16 |
| 4,856,869 A | 8/1989 | Sakata et al. ........... 350/162.18 |
| 4,859,012 A | 8/1989 | Cohn ....................... 350/96.24 |
| 4,859,060 A | 8/1989 | Katagiri et al. ............. 356/352 |
| 4,866,488 A | 9/1989 | Frensley ........................ 357/4 |
| 4,882,683 A | 11/1989 | Rupp et al. .................. 364/521 |
| 4,896,325 A | 1/1990 | Coldren ........................ 372/20 |
| 4,896,948 A | 1/1990 | Dono et al. ................. 350/355 |
| 4,897,708 A | 1/1990 | Clements ...................... 357/65 |
| 4,902,083 A | 2/1990 | Wells .......................... 350/6.6 |
| 4,915,463 A | 4/1990 | Barbee, Jr. ................... 350/1.1 |
| 4,915,479 A | 4/1990 | Clarke ........................ 350/345 |
| 4,924,413 A | 5/1990 | Suwannukul ............... 364/521 |
| 4,926,241 A | 5/1990 | Carey ........................... 357/75 |
| 4,934,773 A | 6/1990 | Becker ........................ 350/6.6 |
| 4,940,309 A | 7/1990 | Baum .......................... 350/171 |
| 4,943,815 A | 7/1990 | Aldrich et al. .............. 346/108 |
| 4,949,148 A | 8/1990 | Bartelink ..................... 357/74 |
| 4,950,890 A | 8/1990 | Gelbart ................... 250/237 G |
| 4,952,925 A | 8/1990 | Haastert ..................... 340/784 |
| 4,954,789 A | 9/1990 | Sampsell .................... 330/4.3 |
| 4,956,619 A | 9/1990 | Hornbeck .................. 330/4.3 |
| 4,961,633 A | 10/1990 | Ibrahim et al. ............. 350/392 |
| 4,970,575 A | 11/1990 | Soga et al. ................... 357/72 |
| 4,978,202 A | 12/1990 | Yang ...................... 350/331 R |
| 4,982,184 A | 1/1991 | Kirkwood .................. 340/783 |
| 4,982,265 A | 1/1991 | Watanabe et al. ............ 357/75 |
| 4,984,824 A | 1/1991 | Antes et al. ................. 283/91 |
| 4,999,308 A | 3/1991 | Nishiura et al. ............... 437/4 |
| 5,003,300 A | 3/1991 | Wells .......................... 340/705 |
| 5,009,473 A | 4/1991 | Hunter et al. ............... 350/6.6 |
| 5,013,141 A | 5/1991 | Sakata ........................ 350/348 |
| 5,018,256 A | 5/1991 | Hornbeck ................. 29/25.01 |
| 5,022,750 A | 6/1991 | Flasck ........................ 353/31 |
| 5,023,905 A | 6/1991 | Wells et al. ................. 379/96 |
| 5,024,494 A | 6/1991 | Williams et al. ............. 350/3.6 |
| 5,028,939 A | 7/1991 | Hornbeck et al. ........... 346/160 |
| 5,031,144 A | 7/1991 | Persky |
| 5,035,473 A | 7/1991 | Kuwayama et al. ......... 350/3.7 |
| 5,037,173 A | 8/1991 | Sampsell et al. ............. 385/17 |
| 5,039,628 A | 8/1991 | Carey .......................... 437/183 |
| 5,040,052 A | 8/1991 | McDavid ...................... 357/80 |
| 5,041,395 A | 8/1991 | Steffen ....................... 437/206 |
| 5,041,851 A | 8/1991 | Nelson ....................... 346/160 |
| 5,043,917 A | 8/1991 | Okamoto ................... 364/518 |
| 5,048,077 A | 9/1991 | Wells et al. ................... 379/96 |
| 5,049,901 A | 9/1991 | Gelbart ...................... 346/108 |
| 5,058,992 A | 10/1991 | Takahashi .................. 359/567 |
| 5,060,058 A | 10/1991 | Goldenberg et al. .......... 358/60 |
| 5,061,049 A | 10/1991 | Hornbeck .................. 359/224 |
| 5,066,614 A | 11/1991 | Dunaway et al. ........... 437/209 |
| 5,068,205 A | 11/1991 | Baxter et al. ............... 437/205 |
| 5,072,239 A | 12/1991 | Mitcham et al. ........... 346/108 |
| 5,072,418 A | 12/1991 | Boutaud et al. ........ 364/715.06 |
| 5,074,947 A | 12/1991 | Estes et al. .............. 156/307.3 |
| 5,075,940 A | 12/1991 | Kuriyama et al. .......... 29/25.03 |
| 5,079,544 A | 1/1992 | DeMond et al. ............ 340/701 |
| 5,081,617 A | 1/1992 | Gelbart ....................... 369/112 |
| 5,083,857 A | 1/1992 | Hornbeck .................. 359/291 |
| 5,085,497 A | 2/1992 | Um et al. .................... 359/848 |
| 5,089,903 A | 2/1992 | Kuwayama et al. ........... 359/15 |
| 5,093,281 A | 3/1992 | Eshima ....................... 437/217 |
| 5,096,279 A | 3/1992 | Hornbeck et al. ........... 359/230 |
| 5,099,353 A | 3/1992 | Hornbeck .................. 359/291 |
| 5,101,184 A | 3/1992 | Antes ......................... 235/454 |
| 5,101,236 A | 3/1992 | Nelson et al. .............. 355/229 |
| 5,103,334 A | 4/1992 | Swanberg ................... 359/197 |
| 5,105,207 A | 4/1992 | Nelson ....................... 346/160 |
| 5,105,299 A | 4/1992 | Anderson et al. ........... 359/223 |
| 5,105,369 A | 4/1992 | Nelson ....................... 364/525 |
| 5,107,372 A | 4/1992 | Gelbart et al. ............. 359/824 |
| 5,113,272 A | 5/1992 | Reamey ...................... 359/53 |
| 5,113,285 A | 5/1992 | Franklin et al. ............. 359/465 |
| 5,115,344 A | 5/1992 | Jaskie ........................ 359/573 |
| 5,119,204 A | 6/1992 | Hashimoto et al. ......... 358/254 |
| 5,121,343 A | 6/1992 | Faris .......................... 395/111 |
| 5,126,826 A | 6/1992 | Kauchi et al. ................ 357/72 |
| 5,126,836 A | 6/1992 | Um ............................. 358/60 |
| 5,128,660 A | 7/1992 | DeMond et al. ............ 340/707 |
| 5,129,716 A | 7/1992 | Holakovszky et al. ........ 351/50 |
| 5,132,723 A | 7/1992 | Gelbart ........................ 355/40 |
| 5,132,812 A | 7/1992 | Takahashi et al. .............. 359/9 |
| 5,136,695 A | 8/1992 | Goldshlag et al. ........... 395/275 |
| 5,137,836 A | 8/1992 | Lam .............................. 437/8 |
| 5,142,303 A | 8/1992 | Nelson ....................... 346/108 |
| 5,142,405 A | 8/1992 | Hornbeck .................. 359/226 |
| 5,142,677 A | 8/1992 | Ehlig et al. ................. 395/650 |
| 5,144,472 A | 9/1992 | Sang, Jr. et al. ............ 359/254 |
| 5,147,815 A | 9/1992 | Casto ........................... 437/51 |
| 5,148,157 A | 9/1992 | Florence .................... 340/783 |
| 5,148,506 A | 9/1992 | McDonald .................. 385/16 |
| 5,149,405 A | 9/1992 | Bruns et al. .............. 204/129.1 |
| 5,150,205 A | 9/1992 | Um et al. ...................... 358/60 |
| 5,151,718 A | 9/1992 | Nelson ....................... 346/160 |
| 5,151,724 A | 9/1992 | Kikinis ........................ 357/17 |
| 5,153,770 A | 10/1992 | Harris ......................... 359/245 |
| 5,155,604 A | 10/1992 | Miekka et al. ................. 359/2 |
| 5,155,615 A | 10/1992 | Tagawa ....................... 359/213 |
| 5,155,778 A | 10/1992 | Magel et al. .................. 385/1 |
| 5,155,812 A | 10/1992 | Ehlig et al. ................. 395/275 |
| 5,157,304 A | 10/1992 | Kane et al. .................. 313/495 |
| 5,159,485 A | 10/1992 | Nelson ....................... 359/291 |
| 5,161,042 A | 11/1992 | Hamada ....................... 359/41 |
| 5,162,787 A | 11/1992 | Thompson et al. .......... 340/794 |
| 5,164,019 A | 11/1992 | Sinton ......................... 136/249 |
| 5,165,013 A | 11/1992 | Faris .......................... 395/104 |
| 5,168,401 A | 12/1992 | Endriz ........................ 359/625 |
| 5,168,406 A | 12/1992 | Nelson ....................... 359/855 |
| 5,170,156 A | 12/1992 | DeMond et al. ............ 340/794 |
| 5,170,269 A | 12/1992 | Lin et al. ........................ 359/9 |
| 5,170,283 A | 12/1992 | O'Brien et al. ............. 359/291 |
| 5,172,161 A | 12/1992 | Nelson ....................... 355/200 |
| 5,172,262 A | 12/1992 | Hornbeck .................. 359/223 |
| 5,177,724 A | 1/1993 | Gelbart .................... 369/44.16 |

| Patent | Date | Inventor | Class |
|---|---|---|---|
| 5,178,728 A | 1/1993 | Boysel et al. | 156/656 |
| 5,179,274 A | 1/1993 | Sampsell | 250/208.2 |
| 5,179,367 A | 1/1993 | Shimizu | 340/700 |
| 5,181,231 A | 1/1993 | Parikh et al. | 377/26 |
| 5,182,665 A | 1/1993 | O'Callaghan et al. | 359/95 |
| 5,185,660 A | 2/1993 | Um | 358/60 |
| 5,185,823 A | 2/1993 | Kaku et al. | |
| 5,188,280 A | 2/1993 | Nakao et al. | 228/123 |
| 5,189,404 A | 2/1993 | Masimo et al. | 340/720 |
| 5,189,505 A | 2/1993 | Bartelink | 257/419 |
| 5,191,405 A | 3/1993 | Tomita et al. | 257/777 |
| 5,192,864 A | 3/1993 | McEwen et al. | 250/234 |
| 5,192,946 A | 3/1993 | Thompson et al. | 340/794 |
| 5,198,895 A | 3/1993 | Vick | 358/103 |
| 5,202,785 A | 4/1993 | Nelson | 359/214 |
| 5,206,629 A | 4/1993 | DeMond et al. | 340/719 |
| 5,206,829 A | 4/1993 | Thakoor et al. | |
| 5,208,818 A | 5/1993 | Gelbart et al. | 372/30 |
| 5,208,891 A | 5/1993 | Prysner | 385/116 |
| 5,210,637 A | 5/1993 | Puzey | 359/263 |
| 5,212,115 A | 5/1993 | Cho et al. | 437/208 |
| 5,212,555 A | 5/1993 | Stoltz | 358/206 |
| 5,212,582 A | 5/1993 | Nelson | 359/224 |
| 5,214,308 A | 5/1993 | Nishiguchi et al. | 257/692 |
| 5,214,419 A | 5/1993 | DeMond et al. | 340/794 |
| 5,214,420 A | 5/1993 | Thompson et al. | 340/795 |
| 5,216,537 A | 6/1993 | Hornbeck | 359/291 |
| 5,216,544 A | 6/1993 | Horikawa et al. | 359/622 |
| 5,219,794 A | 6/1993 | Satoh et al. | 437/209 |
| 5,220,200 A | 6/1993 | Blanton | 257/778 |
| 5,221,982 A | 6/1993 | Faris | 359/93 |
| 5,224,088 A | 6/1993 | Atiya | 369/97 |
| 5,226,099 A | 7/1993 | Mignardi et al. | 385/19 |
| 5,229,597 A | 7/1993 | Fukatsu | |
| 5,230,005 A | 7/1993 | Rubino et al. | 372/20 |
| 5,231,363 A | 7/1993 | Sano et al. | 332/109 |
| 5,231,388 A | 7/1993 | Stoltz | 340/783 |
| 5,231,432 A | 7/1993 | Glenn | 353/31 |
| 5,233,456 A | 8/1993 | Nelson | 359/214 |
| 5,233,460 A | 8/1993 | Partlo et al. | 359/247 |
| 5,237,340 A | 8/1993 | Nelson | 346/108 |
| 5,237,435 A | 8/1993 | Kurematsu et al. | 359/41 |
| 5,239,448 A | 8/1993 | Perkins et al. | 361/764 |
| 5,240,818 A | 8/1993 | Mignardi et al. | 430/321 |
| 5,245,686 A | 9/1993 | Faris et al. | 385/120 |
| 5,247,180 A | 9/1993 | Mitcham et al. | 250/492.1 |
| 5,247,593 A | 9/1993 | Lin et al. | 385/17 |
| 5,249,245 A | 9/1993 | Lebby et al. | 385/89 |
| 5,251,057 A | 10/1993 | Guerin et al. | 359/249 |
| 5,251,058 A | 10/1993 | MacArthur | 359/249 |
| 5,254,980 A | 10/1993 | Hendrix et al. | 345/84 |
| 5,255,100 A | 10/1993 | Urbanus | 358/231 |
| 5,256,869 A | 10/1993 | Lin et al. | 250/201.9 |
| 5,258,325 A | 11/1993 | Spitzer et al. | 437/86 |
| 5,260,718 A | 11/1993 | Rommelmann et al. | 346/107 R |
| 5,260,798 A | 11/1993 | Um et al. | 358/233 |
| 5,262,000 A | 11/1993 | Welbourn et al. | 156/643 |
| 5,272,473 A | 12/1993 | Thompson et al. | 345/7 |
| 5,278,652 A | 1/1994 | Urbanus et al. | 358/160 |
| 5,278,925 A | 1/1994 | Boysel et al. | 385/14 |
| 5,280,277 A | 1/1994 | Hornbeck | 345/108 |
| 5,281,887 A | 1/1994 | Engle | 310/335 |
| 5,281,957 A | 1/1994 | Schoolman | 345/8 |
| 5,285,105 A | 2/1994 | Cain | 257/672 |
| 5,285,196 A | 2/1994 | Gale, Jr. | 345/108 |
| 5,285,407 A | 2/1994 | Gale et al. | 365/189.11 |
| 5,287,096 A | 2/1994 | Thompson et al. | 345/147 |
| 5,287,215 A | 2/1994 | Warde et al. | 359/293 |
| 5,289,172 A | 2/1994 | Gale, Jr. et al. | 345/108 |
| 5,291,317 A | 3/1994 | Newswanger | 359/15 |
| 5,291,473 A | 3/1994 | Pauli | 369/112 |
| 5,293,511 A | 3/1994 | Poradish et al. | 257/434 |
| 5,296,891 A | 3/1994 | Vogt et al. | 355/67 |
| 5,296,950 A | 3/1994 | Lin et al. | 359/9 |
| 5,298,460 A | 3/1994 | Nishiguchi et al. | 437/183 |
| 5,299,037 A | 3/1994 | Sakata | 359/41 |
| 5,299,289 A | 3/1994 | Omae et al. | 359/95 |
| 5,300,813 A | 4/1994 | Joshi et al. | 257/752 |
| 5,301,062 A | 4/1994 | Takahashi et al. | 359/567 |
| 5,303,043 A | 4/1994 | Glenn | 348/40 |
| 5,303,055 A | 4/1994 | Hendrix et al. | 348/761 |
| 5,307,056 A | 4/1994 | Urbanus | 340/189 |
| 5,307,185 A | 4/1994 | Jones et al. | 359/41 |
| 5,311,349 A | 5/1994 | Anderson et al. | 359/223 |
| 5,311,360 A | 5/1994 | Bloom et al. | 359/572 |
| 5,312,513 A | 5/1994 | Florence et al. | 156/643 |
| 5,313,479 A | 5/1994 | Florence | 372/26 |
| 5,313,648 A | 5/1994 | Ehlig et al. | 395/800 |
| 5,315,418 A | 5/1994 | Sprague et al. | 359/41 |
| 5,315,423 A | 5/1994 | Hong | 359/124 |
| 5,315,429 A | 5/1994 | Abramov | |
| 5,319,214 A | 6/1994 | Gregory et al. | 250/504 R |
| 5,319,668 A | 6/1994 | Luecke | 372/107 |
| 5,319,789 A | 6/1994 | Ehlig et al. | 395/800 |
| 5,319,792 A | 6/1994 | Ehlig et al. | 395/800 |
| 5,320,709 A * | 6/1994 | Bowden et al. | 438/745 |
| 5,321,416 A | 6/1994 | Bassett et al. | 345/8 |
| 5,323,002 A | 6/1994 | Sampsell et al. | 250/252.1 |
| 5,323,051 A | 6/1994 | Adams et al. | 257/417 |
| 5,325,116 A | 6/1994 | Sampsell | 346/108 |
| 5,327,286 A | 7/1994 | Sampsell et al. | 359/561 |
| 5,329,289 A | 7/1994 | Sakamoto et al. | 345/126 |
| 5,330,878 A | 7/1994 | Nelson | 430/311 |
| 5,331,454 A | 7/1994 | Hornbeck | 359/224 |
| 5,334,991 A | 8/1994 | Wells et al. | 345/8 |
| 5,339,116 A | 8/1994 | Urbanus et al. | 348/716 |
| 5,339,177 A | 8/1994 | Jenkins et al. | 359/35 |
| 5,340,772 A | 8/1994 | Rosotker | 437/226 |
| 5,345,521 A | 9/1994 | McDonald et al. | 385/19 |
| 5,347,321 A | 9/1994 | Gove | 348/663 |
| 5,347,378 A | 9/1994 | Handschy et al. | 359/53 |
| 5,347,433 A | 9/1994 | Sedlmayr | 362/32 |
| 5,348,619 A | 9/1994 | Bohannon et al. | 156/664 |
| 5,349,687 A | 9/1994 | Ehlig et al. | 395/800 |
| 5,351,052 A | 9/1994 | D'Hont et al. | 342/42 |
| 5,352,926 A | 10/1994 | Andrews | 257/717 |
| 5,357,369 A | 10/1994 | Pilling et al. | 359/462 |
| 5,359,349 A | 10/1994 | Jambor et al. | 345/168 |
| 5,359,451 A | 10/1994 | Gelbart et al. | 359/285 |
| 5,361,131 A | 11/1994 | Tekemori et al. | 356/355 |
| 5,363,220 A | 11/1994 | Kuwayama et al. | 359/3 |
| 5,365,283 A | 11/1994 | Doherty et al. | 348/743 |
| 5,367,585 A | 11/1994 | Ghezzo et al. | 385/23 |
| 5,371,543 A | 12/1994 | Anderson | 348/270 |
| 5,371,618 A | 12/1994 | Tai et al. | 359/53 |
| 5,382,961 A | 1/1995 | Gale, Jr. | 345/108 |
| 5,387,924 A | 2/1995 | Gale, Jr. et al. | 345/108 |
| 5,389,182 A | 2/1995 | Mignardi | 156/344 |
| 5,391,881 A | 2/1995 | Jeuch et al. | 250/370.09 |
| 5,392,140 A | 2/1995 | Ezra et al. | 359/41 |
| 5,392,151 A | 2/1995 | Nelson | 359/223 |
| 5,394,303 A | 2/1995 | Yamaji | 361/749 |
| 5,398,071 A | 3/1995 | Gove et al. | 348/558 |
| 5,399,898 A | 3/1995 | Rostoker | 257/499 |
| 5,404,365 A | 4/1995 | Hiiro | 372/27 |
| 5,404,485 A | 4/1995 | Ban | 395/425 |
| 5,408,123 A | 4/1995 | Murai | 257/531 |
| 5,410,315 A | 4/1995 | Huber | 342/42 |
| 5,411,769 A | 5/1995 | Hornbeck | 427/534 |
| 5,412,186 A | 5/1995 | Gale | 219/679 |
| 5,412,501 A | 5/1995 | Fisli | 359/286 |
| 5,418,584 A | 5/1995 | Larson | 353/122 |
| 5,420,655 A | 5/1995 | Shimizu | 353/33 |
| 5,420,722 A | 5/1995 | Bielak | 359/708 |
| 5,426,072 A | 6/1995 | Finnila | 437/208 |
| 5,427,975 A | 6/1995 | Sparks et al. | 437/79 |

| | | | | | | | |
|---|---|---|---|---|---|---|---|
| 5,430,524 A | 7/1995 | Nelson | 355/200 | 5,502,481 A | 3/1996 | Dentinger et al. | 348/51 |
| 5,435,876 A | 7/1995 | Alfaro et al. | 156/247 | 5,504,504 A | 4/1996 | Markandey et al. | 345/214 |
| 5,438,477 A | 8/1995 | Pasch | 361/689 | 5,504,514 A | 4/1996 | Nelson | 347/130 |
| 5,439,731 A | 8/1995 | Li et al. | 428/209 | 5,504,575 A | 4/1996 | Stafford | 356/330 |
| 5,442,411 A | 8/1995 | Urbanus et al. | 348/771 | 5,504,614 A | 4/1996 | Webb et al. | 359/223 |
| 5,442,414 A | 8/1995 | Janssen et al. | 353/98 | 5,506,171 A | 4/1996 | Leonard et al. | 437/187 |
| 5,444,566 A | 8/1995 | Gale et al. | 359/291 | 5,506,597 A | 4/1996 | Thompson et al. | 345/85 |
| 5,445,559 A | 8/1995 | Gale et al. | 451/388 | 5,506,720 A | 4/1996 | Yoon | 359/224 |
| 5,446,479 A | 8/1995 | Thompson et al. | 345/139 | 5,508,558 A | 4/1996 | Robinette, Jr. et al. | 257/700 |
| 5,447,600 A | 9/1995 | Webb | 216/2 | 5,508,561 A | 4/1996 | Tago et al. | 257/737 |
| 5,448,314 A | 9/1995 | Heimbuch et al. | 348/743 | 5,508,565 A | 4/1996 | Hatakeyama et al. | 257/777 |
| 5,448,546 A | 9/1995 | Pauli | 369/112 | 5,508,750 A | 4/1996 | Hewlett et al. | 348/558 |
| 5,450,088 A | 9/1995 | Meier et al. | 342/51 | 5,508,840 A | 4/1996 | Vogel et al. | 359/291 |
| 5,450,219 A | 9/1995 | Gold et al. | 359/40 | 5,508,841 A | 4/1996 | Lin et al. | 359/318 |
| 5,451,103 A | 9/1995 | Hatanaka et al. | 353/31 | 5,510,758 A | 4/1996 | Fujita et al. | 333/247 |
| 5,452,024 A | 9/1995 | Sampsell | 348/755 | 5,510,824 A | 4/1996 | Nelson | 347/239 |
| 5,452,138 A | 9/1995 | Mignardi et al. | 359/855 | 5,512,374 A | 4/1996 | Wallace et al. | 428/422 |
| 5,452,747 A | 9/1995 | D'Hont et al. | 342/42 | 5,512,748 A | 4/1996 | Hanson | 250/332 |
| 5,453,778 A | 9/1995 | Venkateswar et al. | 347/239 | 5,515,076 A | 5/1996 | Thompson et al. | 345/139 |
| 5,453,803 A | 9/1995 | Shapiro et al. | 353/119 | 5,516,125 A | 5/1996 | McKenna | 279/3 |
| 5,454,160 A | 10/1995 | Nickel | 29/840 | 5,517,340 A | 5/1996 | Doany et al. | 359/41 |
| 5,454,906 A | 10/1995 | Baker et al. | 216/66 | 5,517,347 A | 5/1996 | Sampsell | 359/224 |
| 5,455,445 A | 10/1995 | Kurtz et al. | 257/419 | 5,517,357 A | 5/1996 | Shibayama | 359/547 |
| 5,455,455 A | 10/1995 | Badehi | 257/690 | 5,517,359 A | 5/1996 | Gelbart | 359/623 |
| 5,455,602 A | 10/1995 | Tew | 347/239 | 5,519,251 A | 5/1996 | Sato et al. | 257/666 |
| 5,457,493 A | 10/1995 | Leddy et al. | 348/164 | 5,519,450 A | 5/1996 | Urbanus et al. | 348/600 |
| 5,457,566 A | 10/1995 | Sampsell et al. | 359/292 | 5,521,748 A | 5/1996 | Sarraf | 359/321 |
| 5,457,567 A | 10/1995 | Shinohara | 359/305 | 5,523,619 A | 6/1996 | McAllister et al. | 257/686 |
| 5,458,716 A | 10/1995 | Alfaro et al. | 156/245 | 5,523,628 A | 6/1996 | Williams et al. | 257/777 |
| 5,459,492 A | 10/1995 | Venkateswar | 347/253 | 5,523,803 A | 6/1996 | Urbanus et al. | 348/771 |
| 5,459,528 A | 10/1995 | Pettitt | 348/568 | 5,523,878 A | 6/1996 | Wallace et al. | 359/290 |
| 5,459,592 A | 10/1995 | Shibatani et al. | 359/40 | 5,523,881 A | 6/1996 | Florence et al. | 359/561 |
| 5,459,610 A | 10/1995 | Bloom et al. | 359/572 | 5,523,920 A | 6/1996 | Machuga et al. | 361/767 |
| 5,461,197 A | 10/1995 | Hiruta et al. | 174/52.4 | 5,524,155 A | 6/1996 | Weaver | 385/24 |
| 5,461,410 A | 10/1995 | Venkateswar et al. | 347/240 | 5,534,883 A | 7/1996 | Koh | 345/3 |
| 5,461,411 A | 10/1995 | Florence et al. | 347/240 | 5,539,422 A | 7/1996 | Heacock et al. | 345/8 |
| 5,461,547 A | 10/1995 | Ciupke et al. | 362/31 | 5,544,306 A | 8/1996 | Deering et al. | 395/164 |
| 5,463,347 A | 10/1995 | Jones et al. | 330/253 | 5,554,304 A | 9/1996 | Suzuki | 216/2 |
| 5,463,497 A | 10/1995 | Muraki et al. | 359/618 | 5,576,878 A | 11/1996 | Henck | 359/224 |
| 5,465,175 A | 11/1995 | Woodgate et al. | 359/463 | 5,602,671 A | 2/1997 | Hornbeck | 359/224 |
| 5,467,106 A | 11/1995 | Salomon | 345/87 | 5,606,181 A | 2/1997 | Sakuma et al. | 257/88 |
| 5,467,138 A | 11/1995 | Gove | 348/452 | 5,606,447 A | 2/1997 | Asada et al. | 359/199 |
| 5,467,146 A | 11/1995 | Huang et al. | 348/743 | 5,610,438 A | 3/1997 | Wallace et al. | 257/682 |
| 5,469,302 A | 11/1995 | Lim | 359/846 | 5,623,361 A | 4/1997 | Engle | 359/291 |
| 5,471,341 A | 11/1995 | Warde et al. | 359/293 | 5,629,566 A | 5/1997 | Doi et al. | 257/789 |
| 5,473,512 A | 12/1995 | Degani et al. | 361/760 | 5,629,801 A | 5/1997 | Staker et al. | 359/572 |
| 5,475,236 A | 12/1995 | Yoshizaki | 257/48 | 5,640,216 A | 6/1997 | Hasegawa et al. | 349/58 |
| 5,480,839 A | 1/1996 | Ezawa et al. | 437/209 | 5,658,698 A | 8/1997 | Yagi et al. | 430/11 |
| 5,481,118 A | 1/1996 | Tew | 250/551 | 5,661,592 A | 8/1997 | Bornstein et al. | 359/291 |
| 5,481,133 A | 1/1996 | Hsu | 257/621 | 5,661,593 A | 8/1997 | Engle | 359/292 |
| 5,482,564 A | 1/1996 | Douglas et al. | 134/18 | 5,663,817 A | 9/1997 | Frapin et al. | 349/5 |
| 5,482,818 A | 1/1996 | Nelson | 430/394 | 5,668,611 A | 9/1997 | Ernstoff et al. | 348/771 |
| 5,483,307 A | 1/1996 | Anderson | 353/98 | 5,673,139 A | 9/1997 | Johnson | 359/291 |
| 5,485,172 A | 1/1996 | Sawachika et al. | 345/8 | 5,677,783 A | 10/1997 | Bloom et al. | 359/224 |
| 5,485,304 A | 1/1996 | Kaeriyama | 359/291 | 5,689,361 A | 11/1997 | Damen et al. | 359/284 |
| 5,485,354 A | 1/1996 | Ciupke et al. | 362/31 | 5,691,836 A | 11/1997 | Clark | 359/247 |
| 5,486,698 A | 1/1996 | Hanson et al. | 250/332 | 5,696,560 A | 12/1997 | Songer | 348/436 |
| 5,486,841 A | 1/1996 | Hara et al. | 345/8 | 5,699,740 A | 12/1997 | Gelbart | 101/477 |
| 5,486,946 A | 1/1996 | Jachimowicz et al. | 359/263 | 5,704,700 A | 1/1998 | Kappel et al. | 353/31 |
| 5,488,431 A | 1/1996 | Gove et al. | 348/716 | 5,707,160 A | 1/1998 | Bowen | 400/472 |
| 5,489,952 A | 2/1996 | Gove et al. | 348/771 | 5,712,649 A | 1/1998 | Tosaki | 345/8 |
| 5,490,009 A | 2/1996 | Venkateswar et al. | 359/291 | 5,713,652 A | 2/1998 | Zavracky et al. | 353/122 |
| 5,491,510 A | 2/1996 | Gove | 348/77 | 5,731,802 A | 3/1998 | Aras et al. | 345/148 |
| 5,491,612 A | 2/1996 | Nicewarner, Jr. | 361/760 | 5,734,224 A | 3/1998 | Tagawa et al. | 313/493 |
| 5,491,715 A | 2/1996 | Flaxl | 375/344 | 5,742,373 A | 4/1998 | Alvelda | 349/204 |
| 5,493,177 A | 2/1996 | Muller et al. | 313/578 | 5,744,752 A | 4/1998 | McHerron et al. | 174/52.4 |
| 5,493,439 A | 2/1996 | Engle | 359/292 | 5,745,271 A | 4/1998 | Ford et al. | 359/130 |
| 5,497,172 A | 3/1996 | Doherty et al. | 345/85 | 5,757,354 A | 5/1998 | Kawamura | 345/126 |
| 5,497,197 A | 3/1996 | Gove et al. | 348/388 | 5,757,536 A | 5/1998 | Ricco et al. | 359/224 |
| 5,497,262 A | 3/1996 | Kaeriyama | 359/223 | 5,764,280 A | 6/1998 | Bloom et al. | 348/53 |
| 5,499,060 A | 3/1996 | Gove et al. | 348/651 | 5,768,009 A | 6/1998 | Little | 359/293 |
| 5,499,062 A | 3/1996 | Urbanus | 348/771 | 5,793,519 A | 8/1998 | Furlani et al. | 359/291 |
| 5,500,761 A | 3/1996 | Goossen et al. | 359/290 | 5,798,743 A | 8/1998 | Bloom | 345/90 |

| | | | |
|---|---|---|---|
| 5,798,805 A | 8/1998 | Ooi et al. ............... 349/10 |
| 5,802,222 A | 9/1998 | Rasch et al. ............ 385/1 |
| 5,808,323 A | 9/1998 | Spaeth et al. ............ 257/88 |
| 5,808,797 A | 9/1998 | Bloom et al. ............ 359/572 |
| 5,815,126 A | 9/1998 | Fan et al. ............... 345/8 |
| 5,825,443 A | 10/1998 | Kawasaki et al. ......... 349/95 |
| 5,835,255 A | 11/1998 | Miles .................. 359/291 |
| 5,835,256 A | 11/1998 | Huibers ................ 359/291 |
| 5,837,562 A | 11/1998 | Cho .................... 438/51 |
| 5,841,579 A | 11/1998 | Bloom et al. ............ 359/572 |
| 5,844,711 A | 12/1998 | Long, Jr. ............... 359/291 |
| 5,847,859 A | 12/1998 | Murata ................ 359/201 |
| 5,862,164 A | 1/1999 | Hill ................... 372/27 |
| 5,886,675 A | 3/1999 | Aye et al. ............... 345/7 |
| 5,892,505 A | 4/1999 | Tropper ............... 345/208 |
| 5,895,233 A | 4/1999 | Higashi et al. ........... 438/107 |
| 5,898,515 A | 4/1999 | Furlani et al. ........... 359/290 |
| 5,903,243 A | 5/1999 | Jones .................. 345/7 |
| 5,903,395 A | 5/1999 | Rallison et al. .......... 359/630 |
| 5,910,856 A | 6/1999 | Ghosh et al. ............ 359/291 |
| 5,912,608 A | 6/1999 | Asada ................ 335/222 |
| 5,914,801 A | 6/1999 | Dhuler et al. ............ 359/230 |
| 5,915,168 A | 6/1999 | Salatino et al. .......... 438/110 |
| 5,919,548 A | 7/1999 | Barron et al. ............ 428/138 |
| 5,920,411 A | 7/1999 | Duck et al. ............. 359/127 |
| 5,920,418 A | 7/1999 | Shiono et al. ........... 359/246 |
| 5,923,475 A | 7/1999 | Kurtz et al. ............. 359/619 |
| 5,926,309 A | 7/1999 | Little .................. 359/293 |
| 5,926,318 A | 7/1999 | Hebert ................ 359/618 |
| 5,949,390 A | 9/1999 | Nomura et al. .......... 345/32 |
| 5,949,570 A | 9/1999 | Shiono et al. ........... 359/291 |
| 5,953,161 A | 9/1999 | Troxell et al. ........... 359/618 |
| 5,963,788 A | 10/1999 | Barron et al. ............ 438/48 |
| 5,978,127 A | 11/1999 | Berg .................. 359/279 |
| 5,982,553 A | 11/1999 | Bloom et al. ............ 359/627 |
| 5,986,634 A | 11/1999 | Alioshin ............... 345/126 |
| 5,986,796 A | 11/1999 | Miles ................. 359/260 |
| 5,995,303 A | 11/1999 | Honguh et al. .......... 359/708 |
| 5,999,319 A | 12/1999 | Castracane ............ 359/573 |
| 6,004,912 A | 12/1999 | Gudeman ............. 508/577 |
| 6,016,222 A | 1/2000 | Setani et al. ........... 359/571 |
| 6,025,859 A | 2/2000 | Ide et al. .............. 347/135 |
| 6,038,057 A | 3/2000 | Brazas, Jr. et al. ........ 359/291 |
| 6,055,090 A | 4/2000 | Miles ................. 359/291 |
| 6,061,166 A | 5/2000 | Furlani et al. ........... 359/254 |
| 6,061,489 A | 5/2000 | Ezra .................. 385/115 |
| 6,062,461 A | 5/2000 | Sparks et al. .......... 228/123.1 |
| 6,064,404 A | 5/2000 | Aras et al. ............. 345/507 |
| 6,069,392 A | 5/2000 | Tai et al. .............. 257/419 |
| 6,071,652 A | 6/2000 | Feldman et al. ......... 430/5 |
| 6,075,632 A | 6/2000 | Braun ................ 359/124 |
| 6,084,626 A | 7/2000 | Ramanujan et al. ...... 347/239 |
| 6,088,102 A | 7/2000 | Manhart .............. 356/354 |
| 6,091,521 A | 7/2000 | Popovich ............. 359/15 |
| 6,096,576 A | 8/2000 | Corbin et al. ........... 438/108 |
| 6,096,656 A * | 8/2000 | Matzke et al. .......... 438/702 |
| 6,097,352 A | 8/2000 | Zavracky et al. ........ 345/7 |
| 6,101,036 A | 8/2000 | Bloom ................ 359/567 |
| 6,115,168 A | 9/2000 | Zhao et al. ............ 359/247 |
| 6,122,299 A | 9/2000 | DeMars et al. ......... 372/20 |
| 6,123,985 A | 9/2000 | Robinson et al. ........ 427/162 |
| 6,124,145 A | 9/2000 | Stemme et al. ......... 438/26 |
| 6,130,770 A | 10/2000 | Bloom ................ 359/224 |
| 6,144,481 A | 11/2000 | Kowarz et al. .......... 359/291 |
| 6,147,789 A | 11/2000 | Gelbart ............... 359/231 |
| 6,154,259 A | 11/2000 | Hargis et al. ........... 348/756 |
| 6,154,305 A | 11/2000 | Dickensheets et al. |
| 6,163,026 A | 12/2000 | Bawolek et al. ........ 250/351 |
| 6,163,402 A | 12/2000 | Chou et al. ........... 359/443 |
| 6,169,624 B1 | 1/2001 | Godil et al. ........... 359/237 |
| 6,172,796 B1 | 1/2001 | Kowarz et al. ......... 359/290 |
| 6,177,980 B1 | 1/2001 | Johnson .............. 355/67 |
| 6,181,458 B1 | 1/2001 | Brazas, Jr. et al. ....... 359/290 |
| 6,188,519 B1 | 2/2001 | Johnson .............. 359/572 |
| 6,195,196 B1 | 2/2001 | Kimura et al. ......... 359/295 |
| 6,210,988 B1 | 4/2001 | Howe et al. .......... 438/50 |
| 6,215,579 B1 | 4/2001 | Bloom et al. ......... 359/298 |
| 6,219,015 B1 | 4/2001 | Bloom et al. ......... 345/87 |
| 6,222,954 B1 | 4/2001 | Riza ................. 385/18 |
| 6,229,650 B1 | 5/2001 | Reznichenko et al. ... 359/566 |
| 6,249,381 B1 | 6/2001 | Suganuma |
| 6,251,842 B1 | 6/2001 | Gudeman ........... 508/577 |
| 6,252,697 B1 | 6/2001 | Hawkins et al. ....... 359/290 |
| 6,268,952 B1 | 7/2001 | Godil et al. ......... 359/291 |
| 6,271,808 B1 | 8/2001 | Corbin .............. 345/7 |
| 6,282,213 B1 | 8/2001 | Gutin et al. |
| 6,290,859 B1 | 9/2001 | Fleming et al. ....... 216/2 |
| 6,290,864 B1 * | 9/2001 | Patel et al. .......... 216/79 |
| 6,303,986 B1 | 10/2001 | Shook .............. 257/680 |
| 6,310,018 B1 | 10/2001 | Behr et al. .......... 510/175 |
| 6,313,901 B1 | 11/2001 | Cacharelis |
| 6,323,984 B1 | 11/2001 | Trisnadi ............ 359/245 |
| 6,342,960 B1 | 1/2002 | McCullough ........ 359/124 |
| 6,346,430 B1 | 2/2002 | Raj et al. |
| 6,356,577 B1 | 3/2002 | Miller ............. 372/107 |
| 6,356,689 B1 | 3/2002 | Greywall ........... 385/52 |
| 6,384,959 B1 | 5/2002 | Furlani et al. ........ 359/291 |
| 6,387,723 B1 | 5/2002 | Payne et al. ........ 438/48 |
| 6,396,789 B1 | 5/2002 | Guerra et al. ....... 369/112 |
| 6,409,876 B1 * | 6/2002 | McQuarrie et al. .... 156/345.29 |
| 6,418,152 B1 | 7/2002 | Davis |
| 6,421,179 B1 | 7/2002 | Gutin et al. ........ 359/572 |
| 6,438,954 B1 | 8/2002 | Goetz et al. |
| 6,445,502 B1 | 9/2002 | Islam et al. ........ 359/571 |
| 6,452,260 B1 | 9/2002 | Corbin et al. ....... 257/686 |
| 6,479,811 B1 | 11/2002 | Kruschwitz et al. |
| 6,480,634 B1 | 11/2002 | Corrigan ........... 385/4 |
| 6,497,490 B1 | 12/2002 | Miller et al. ....... 359/614 |
| 6,525,863 B1 | 2/2003 | Riza ............... 359/290 |
| 6,563,974 B2 | 5/2003 | Agha Riza ......... 385/18 |
| 6,569,717 B1 | 5/2003 | Murade |
| 6,736,987 B1 * | 5/2004 | Cho ............... 216/58 |
| 2001/0019454 A1 | 9/2001 | Tadic-Galeb et al. .... 359/649 |
| 2002/0015230 A1 | 2/2002 | Pilossof et al. ....... 359/558 |
| 2002/0021485 A1 | 2/2002 | Pilossof ........... 359/295 |
| 2002/0079432 A1 | 6/2002 | Lee et al. .......... 250/216 |
| 2002/0105725 A1 | 8/2002 | Sweatt et al. ....... 359/566 |
| 2002/0112746 A1 | 8/2002 | DeYoung et al. .... 134/36 |
| 2002/0121502 A1 * | 9/2002 | Paterl et al. ....... 216/73 |
| 2002/0131228 A1 * | 9/2002 | Potter ............. 361/233 |
| 2002/0131230 A1 | 9/2002 | Potter ............. 361/277 |
| 2002/0135708 A1 | 9/2002 | Murden et al. |
| 2002/0176151 A1 | 11/2002 | Moon et al. |
| 2003/0056078 A1 | 3/2003 | Johansson et al. |
| 2004/0069747 A1 * | 4/2004 | Patel et al. ....... 216/59 |
| 2004/0191946 A1 * | 9/2004 | Patel et al. ....... 438/57 |

FOREIGN PATENT DOCUMENTS

| | | | |
|---|---|---|---|
| GB | 2391384 | * | 8/2004 |
| JP | 10-209088 | * | 8/1998 |

OTHER PUBLICATIONS

U.S. Appl. No. 60/275,386.*

* cited by examiner

MICROELECTRONIC MECHANICAL SYSTEM AND METHODS

RELATED APPLICATION(S)

This patent application is a continuation-in-part of the co-pending U.S. patent application Ser. No. 09/952,626, filed Sep. 13, 2001, and entitled "MICROELECTRONIC MECHANICAL SYSTEM AND METHODS". The co-pending U.S. patent application Ser. No. 09/952,626, filed Sep. 13, 2001, and entitled "MICROELECTRONIC MECHANICAL SYSTEM AND METHODS" is hereby incorporated by reference.

FIELD OF THE INVENTION

The present invention relates to wafer processing. More particularly, the present invention relates to methods for encapsulation of microelectronic mechanical systems.

BACKGROUND OF INVENTION

The combination microelectronic mechanical systems (MEMS) and integrated circuits (ICs) allows for the possibility to make any number of micro-sensors, transducers and actuators. Unfortunately, typical methods for making MEMS are incompatible methods used to fabricate ICs. Hence, MEMS and ICs are usually fabricated separately and laboriously combined in subsequent and separate steps.

In addition to the MEMS and ICs processing incompatibilities, MEMS typically require encapsulation, whereby the active portions of the MEMS are sealed within a controlled storage environment. One way to encapsulate the active portions of the MEMS is to provide unique customized packaging structure configured with conductive leads fitted for the MEMS. Alternatively, the MEMS can be formed on a wafer substrate that serves as a bottom portion of the packaging structure. After the MEMS is formed on the wafer, then a matched lid structure is glued or soldered over the active potions of the MEMS to seal the MEMS within the suitable storage environment. For example, Shook describes a method and apparatus for hermetically passivating a MEMS on a semi-conductor substrate in U.S. patent application Ser. No. 09/124,710, and U.S. patent application Ser. No. 08/744,372, filed Jul. 29, 1998 and both entitled METHOD OF AND APPARATUS FOR SEALING A HERMETIC LID TO A SEMICONDUCTOR DIE, the contents of both of which are hereby incorporated by reference.

A grating light valve™ light modulator is one type of optical MEMS that is used to modulate one or more wavelengths of light. A grating light valve™ light modulator comprises a plurality of reflective ribbons which move relative to a second set of ribbon and/or a reference surface to modulate a incident light source. Grating light valve™ light modulators have applications in display, print, optical and electrical device technologies. Examples of a grating light valve™ light modulators and their uses are disclosed in the U.S. Pat. No. 5,311,360, issued to Bloom et al., which is hereby incorporated by reference. More advanced designs and techniques for making grating light valve™ light modulators, also referred to as flat light valves, are described in the U.S. Pat. No. 5,841,579 and the U.S. Pat. No. 5,808,797, both issued to Bloom et al., the contents of which are also both hereby incorporated by reference.

Many of the current processing technologies that are available for the fabrication of MEMS do not provide sufficient throughput, selectively or are incompatible with standard CMOS materials. Further in the case of grating light values current processing often leads to stiction of the movable ribbon structures (a condition whereby the ribbons stick to the substrate) and/or results in the degradation of the reflective coating on the ribbons.

What is needed is a method to make MEMS and other micro-structures utilizing processes that are compatible with standard CMOS material and/or IC wafer processing, and preferably whereby MEMS and ICs are capable of being fabricated on the same wafer chip. Further, what is needed is a method to fabricate MEMS, wherein the active portions of the MEMS are readily encapsulated within a variety of suitable storage environments.

SUMMARY OF THE INVENTION

The current invention provides a method of making an encapsulated release structure. Preferably, the release structure is a MEMS device having a plurality of ribbons or beams, which may further have a comb structure. In an embodiment of the instant invention, the device comprises a resonator that can be used for periodic waveform generation (e.g. clock generation). In other embodiments, the device comprises a grating light valve™ light modulator for generation and/or transmission of optical information. In yet other embodiments, the device comprises a radio frequency (RF) generator for wireless transmission of information.

The release structure is formed between layers of a multi-layer structure. The multi-layer structure preferably comprises a first and a second etch-stop layer, which can be the same as or different from each other, and a first sacrificial layer between the first and the second etch-stop layer. Release features are patterned into the second etch-stop layer. Preferably, the multi-layer structure is formed on a silicon wafer substrate. The silicon wafer substrate is preferably configured to couple the MEMS device with an integrated circuit (IC), also formed on the silicon wafer substrate.

Preferably, the multi-layer structure is formed with a first etch-stop layer that is deposited on, or over, a selected region of the silicon wafer substrate. The first etch-stop layer is preferably a silicon dioxide layer, a silicon nitride layer or a combination thereof. On top of, or over, the first etch-stop layer the first sacrificial layer is formed. The first sacrificial layer preferably comprises a poly-silicon material though other materials can also be used. The second etch-stop layer is formed on, or over, the first sacrificial layer with a pattern corresponding to release features of the release structure.

The second etch-stop layer is patterned with the release structure features using any suitable patterning technique. Accordingly, a patterned photo-resist can be formed on or over the second etch-stop layer prior to removing a portion thereof to form a patterned second etch-stop layer having gaps therein and between portions of the second etch-stop layer under the patterned photo-resist. Alternatively, the first sacrificial layer can be anisotropically etched with a positive impression of the release structure features. The positive impression of the release structure features provides nuclei for rapid anisotropic growth of release structure features onto the patterned portions of the first sacrificial layer during the deposition of the second etch-stop layer. Regardless, of the method used to form the second etch-stop layer, a second sacrificial layer is formed over the second etch-stop layer sandwiching or embedding the second etch-stop layer having the release structure features between the first and the second sacrificial layers. The second sacrificial layer preferably comprises poly-silicon. On top of the second sacrificial layer a sealant layer or capping layer is formed. The capping layer preferably comprises one or more conventional passivation layers and more preferably comprises a silicon oxide layer, a silicon nitride layer or a combination thereof.

The etch-stop layers are formed by any number of methods. An etch-stop layer can be formed from any materials that show resistance to etching under specified etching conditions relative to the materials that form the sacrificial layer(s). In the instant invention the etching rate (mass or thickness of material etched per unit time) of sacrificial materials(s) relative to the etch-stop layer materials is preferably greater than 10:1, more preferably greater than 50:1 and most preferably greater than 100:1. In developing the present invention, experimental results of approximately 2500:1 have been achieved. Any particular etch-stop layer can comprise one or more layers, any of which can be exposed to the sacrificial layer etchant as long as the etch-stop layer exhibits sufficient resistance to the sacrificial layer etchant.

In an embodiment of the instant invention, one or more of the etch-stop layers of the multi-layer structure comprise silicon oxide. Preferably the silicon oxide is silicon dioxide; when silicon oxide is referred to in this document, silicon dioxide is the most preferred embodiment, although conventional, doped and/or non-stoichiometric silicon oxides are also contemplated. Silicon oxide layers can be formed by thermal growth, whereby heating a silicon surface in the presence of an oxygen source forms the silicon oxide layer. Alternatively, the silicon oxide layers can be formed by chemical vapor deposition processes, whereby an organic silicon vapor source is decomposed in the presence of oxygen. Likewise, the silicon nitride layers can be formed by thermal growth or chemical deposition processes. The poly-silicon sacrificial layers are preferably formed by standard IC processing methods, such as chemical vapor deposition, sputtering or plasma enhanced chemical vapor deposition (PECVD). At any time before the formation of a subsequent layer, the deposition surface can be cleaned or treated. After the step of patterning the release structure, for example, the deposition surface can be treated or cleaned with a solvent such as N-methyl-2-pyrolipone (NMP) in order to remove residual photo-resist polymer and/or treated with solution of ethylene glycol and ammonium fluoride (NOE) which is believed to remove surface oxides. Further, at any time before the formation of a subsequent layer, the deposition surface can be mechanically planarized.

After the multi-layer structure is formed with the release structure (e.g. patterned from the second etch-stop) sandwiched between the first and the second sacrificial layers, access holes or trenches are formed in the capping or sealant layer, thereby exposing regions of the second sacrificial layer therebelow. Access trenches are referred to, herein, generally as cavitations formed in the capping or sealant layer which allows the sacrificial layer etchant to etch the material in the sacrificial layer therebelow. For simplicity, the term access trenches is used herein to encompass both elongated and symmetrical (e.g. holes, rectangles, squares, ovals, etc.) cavitations in the capping or sealant layer.

In accordance with the instant invention, access trenches can have any number of shapes or geometries, but are preferably anisotropically etched to have steep wall profiles. The access trenches are preferably formed by etching techniques including wet etching processes and reactive ion etching processes though other conventional techniques can be used. The exposed regions of the second sacrificial layer are then treated to a suitable etchant which selectively etches substantial portions of the first and second sacrificial layers portion so the release structures are suspended under the capping or sealant layer. Preferably, the etching processes results in an over-etch of 50% of greater for the sacrificial layers.

The preferred etchant comprises a noble gas fluoride, such as xenon difluoride. The exposed regions of the second sacrificial layer can be treated with a pre-etch solution of ethylene glycol and ammonium fluoride (NOE) prior to selectively etching the first and second sacrificial layers. The pre-etch solution can prevent the formation of oxide, clean exposed regions of the second sacrificial layer, remove polymers and/or help to ensure that etching is not quenched by the formation of oxides. Surface can also be cleaned with a solvent such as N-methyl-2-pyrolipone (NMP) to remove residues, as explained above.

The etching step is preferably performed in a chamber, wherein the etchant is a gas. However, suitable liquid etchants are considered to be within the scope of the current invention, whereby the noble gas fluoride is a liquid or is dissolved in suitable solvent. Etching can be performed in a commercially available cluster tool equipped with a load lock for transporting a wafer comprising the multi-layer structure in an out of the process chamber and coupled to a suitable etchant, as described in detail below.

In the preferred method of the instant invention the multi-layer structure is placed under vacuum with a pressure of approximately $10^{-5}$ Torr. It is important that the structure is placed under vacuum with a partial pressure of water that is $5 \times 10^{-4}$ Torr or less to maintain the selectivity of the etching process. A container with Xenon Difluoride crystals is coupled to the chamber through a pressure controller (e.g. a controllable valve). The crystals are preferably at room temperature within the container with the pressure of Xenon Difluoride of approximately 4.0 Torr. The pressure controller is adjusted such that the pressure within the chamber is raised to approximately 50 milliTorr. More preferably the pressure controller is adjusted such that the pressure within the chamber is raised to be in a range of 60 to 80 milliTorr. This pressure, or an alternatively sufficient pressure, is provided to ensure a controllable etching rate, a positive flow of Xenon Difluoride to the chamber and excellent uniformity of the etch processes. During the etching processes, it is further preferred that the multi-layer structure is resting on or is coupled to a heat sink that is maintained at or cooled to a temperature of approximately 20 degrees Celsius or below.

After the etching step, the access trenches maybe sealed to encapsulate the suspended release structure between the first etch-stop layer and the capping or sealant layer. The sealing step is performed at a separate processing station within a multi-station wafer processing system or, alternatively, is performed within a chamber apparatus. The access trenches can be sealed by any number of methods including sputtering, chemical vapor deposition (CVD), plasma enhanced chemical vapor deposition (PECVD), or spin on glass methods. The access trenches can be sealed with any number of materials including metals, polymers and ceramics. Preferably, the access trenches are sealed by sputtering a layer of aluminum over the access trenches and the capping layer. For optical applications, excess aluminum can be removed from the capping or sealant layer using a suitable mechanical or chemical method.

In accordance with alternative embodiments of the invention, before depositing the second sacrificial layer on the patterned second etch-stop layer, the second etch-stop layer may have a reflective material deposited thereon. The reflective material preferably comprises aluminum. Accordingly, after the sacrificial layers are etched away, the release features preferably have a reflective upper surface suitable for optical applications.

In yet other embodiments of the invention, a gettering material, such as titanium or a titanium-based alloy can be deposited within a cavity capped by the capping or sealant layer prior to sealing the access trenches. The gettering material is provided to help reduce residual moisture and/or oxygen which can lead to performance degradation of the device over time. The release structure is preferably sealed under a vacuum or, alternatively, under a suitable noble gas atmosphere, as described in detail below.

The invention provides a sealed MEMS device (which can be formed on an IC chip) intermediate elements thereof and also a method of forming the same using techniques that are preferably compatible with standard IC processing and IC processing materials. For example, the method of the instant invention provides for processing steps that are preferably carried out at temperatures below 600 degrees Celsius and more preferably at temperatures below 550 degrees Celsius.

The current invention further provides for a method to fabricate MEMS with active structures which are hermetically sealed in a variety of storage environments. The current invention is not limited to making MEMS and can be used to make any number of simple or complex multi-cavity structures that have micro-fluid applications or any other application where an internalized multi-cavity silicon-based structure is preferred. Also, as will be clear from the ensuing discussion that the method of the instant invention is capable of being used to form any number of separate or coupled release structures within a single etching process and that larger devices can also be formed using the method of the instant invention.

BRIEF DESCRIPTION OF THE DRAWINGS

FIG. 4 is a block diagram outlining steps for forming a multi-layer structure illustrated in FIG. 3a.

FIG. 5 is a block-diagram outlining the method of forming the release structure from the multi-layered structure, such as shown in FIG. 2a.

DETAILED DESCRIPTION OF THE INVENTION

Figure 1:
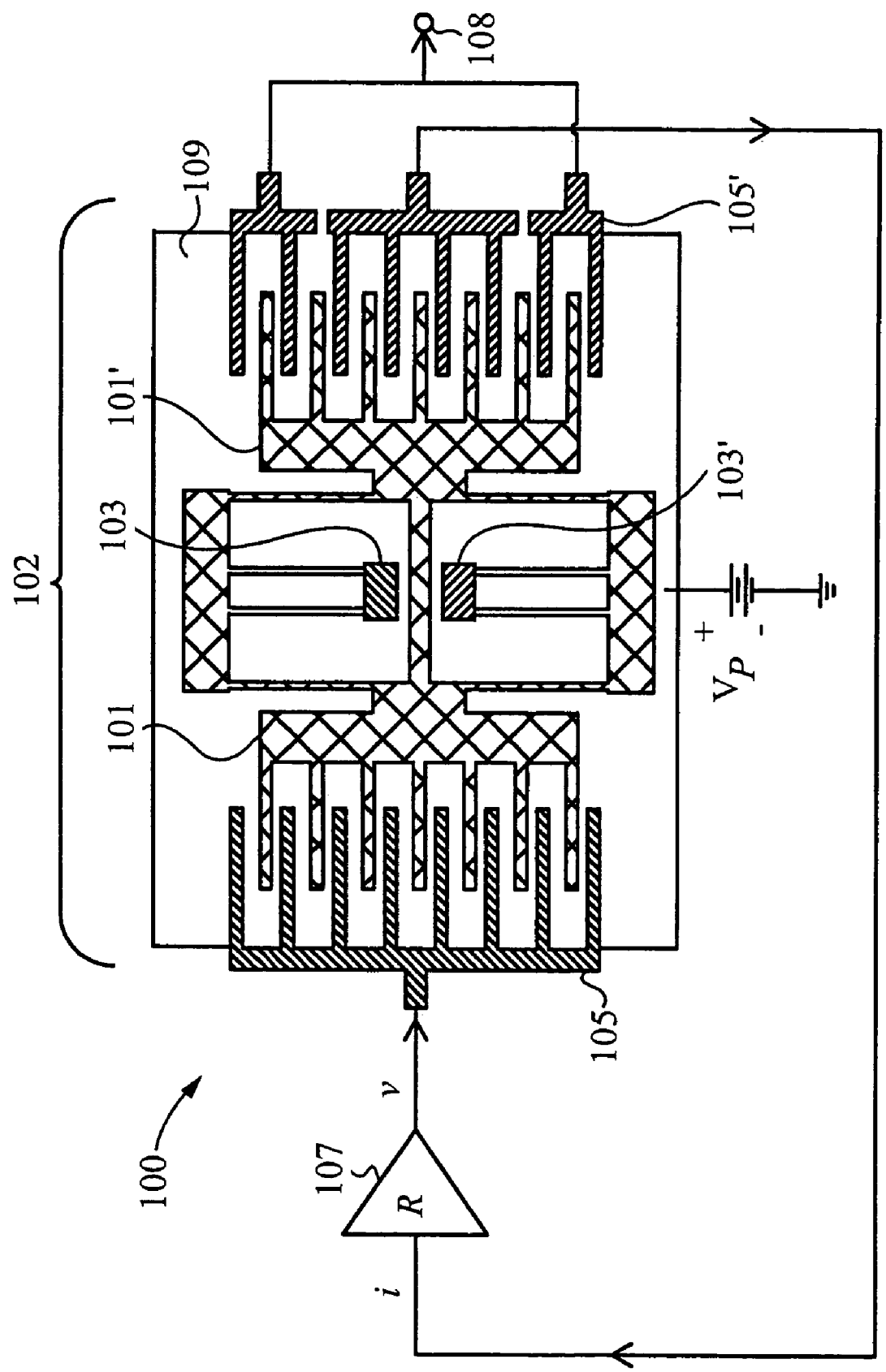
FIG. 1 is a schematic illustrating a MEMS oscillator.

In general, the present invention provides a method to make devices with encapsulated release structures. The current invention is particularly useful for fabricating MEMS oscillators, optical display devices (such as grating light valve™ light modulators and flat light valves), optical transmission devices, RF devices and related devices. MEMS oscillators can have any number or simple or complex configurations, but they all operate on the basic principle of using the fundamental oscillation frequency of the structure to provide a timing signal to a coupled circuit. Referring to FIG. 1, a resonator structure 102 has a set of movable comb features 101 and 101' that vibrate between a set of matched transducer combs 105 and 105'. The resonator structure 102, like a pendulum, has a fundamental resonance frequency. The comb features 101 and 101' are secured to a ground plate 109 through anchor features 103 and 103'. In operation, a dc-bias is applied between the resonator 102 and a ground plate 109. An ac -excitation frequency is applied to the comb transducers 105 and 105' causing the movable comb features 101 and 101' to vibrate and generate a motional output current. The motional output current is amplified by the current to voltage amplifier 107 and fed back to the resonator structure 102. This positive feed-back loop destabilizes the oscillator 100 and leads to sustained oscillations of the resonator structure 102. A second motional output current is generated to the connection 108, which is coupled to a circuit (not shown) for receiving a timing signal generated by the oscillator 100.

Figure 2A:
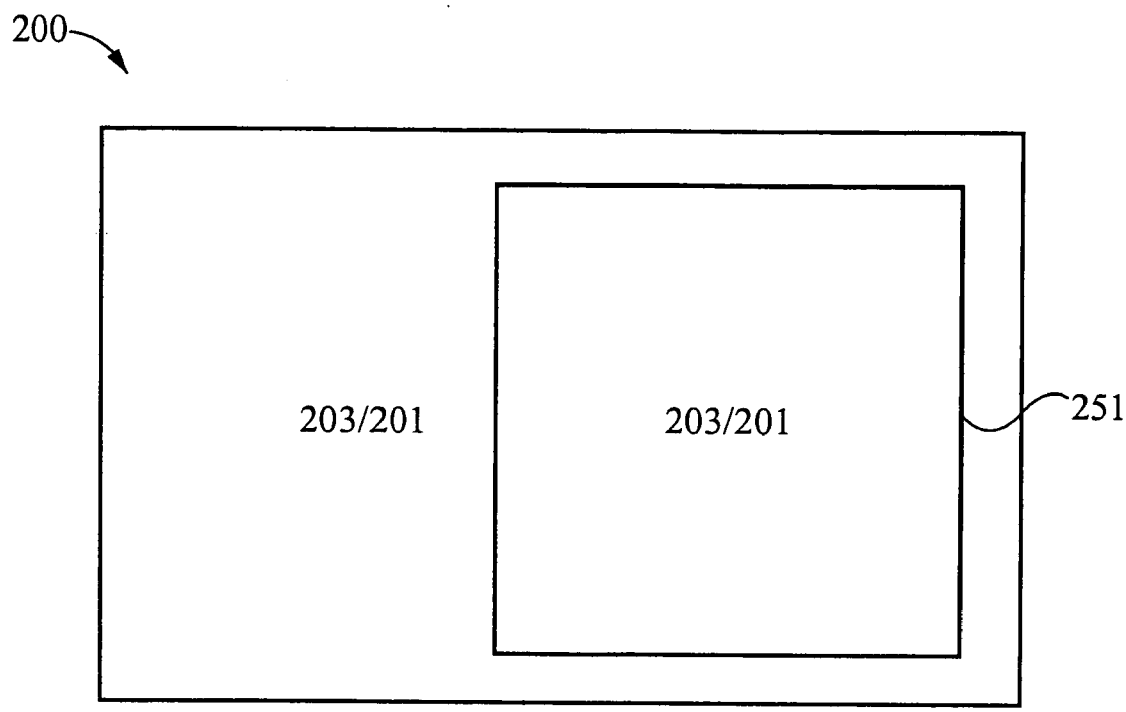
FIGS. 2a–h illustrate top views and cross-sectional views of a multi-layer structure formed on silicon wafer substrate, in accordance with current invention.

Referring now to FIG. 2a showing a plan view of a wafer, a wafer structure. The wafer structure 200 preferably comprises a silicon substrate 201 and a first etch-stop layer 203. The first etch-stop layer 203 may not be required to perform the methods of the instant invention, especially when the silicon substrate 201 is sufficiently thick to allow sacrificial layers to be etched without completely etching away the silicon substrate 201. Also, the substrate 201 itself can be formed from or doped with a material that renders the substrate 201 substantially resistant to the etchant that is used, such that the formation of the first-etch-stop layer 203 is not required. However, in an alternative embodiments, a material that can be selectively etched relative to a silicon substrate can be selected or used as the sacrificial layer. In embodiments where a first etch-stop layer is present, the first etch-stop layer 203 preferably comprises silicon oxide, silicon nitride, a combination thereof or any other suitable material which exhibits sufficient resistance to the etchant used to etch the first sacrificial layer.

Still referring to FIG. 2a, a region 251 of the wafer structure 200 is used to form the release structure. Other portions of the wafer structure 200 can be reserved for forming an integrated circuit that can be electrically coupled to and that can control operation of the release structure formed in the region 251. In addition, any number of release structures and release structure regions 251 can be formed on the same wafer structure 200.

Figure 2B:
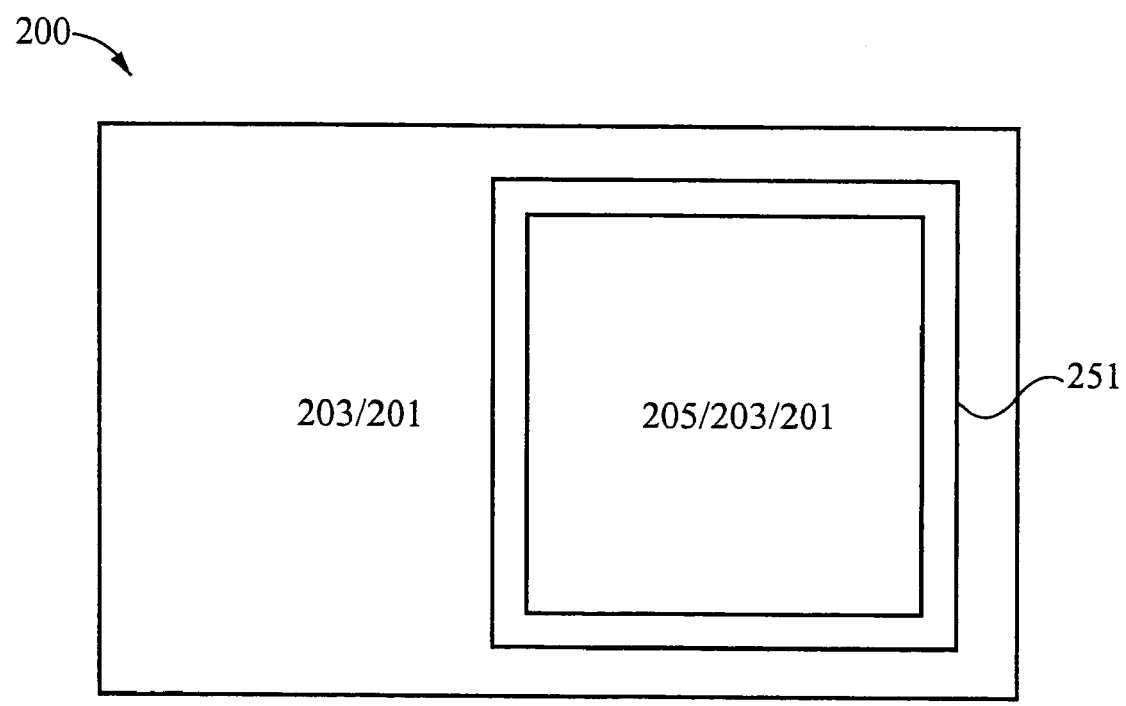

Now referring to FIG. 2b, in the region 251, a first sacrificial layer 205 is formed over the first etch-stop layer 203 using any conventional technique. The first sacrificial layer 205 is formed from any suitable material that can be selectively etched relative to the underlying first etch-stop layer(s) or substrate 201, but preferably comprises polysilicon.

Figure 2C:
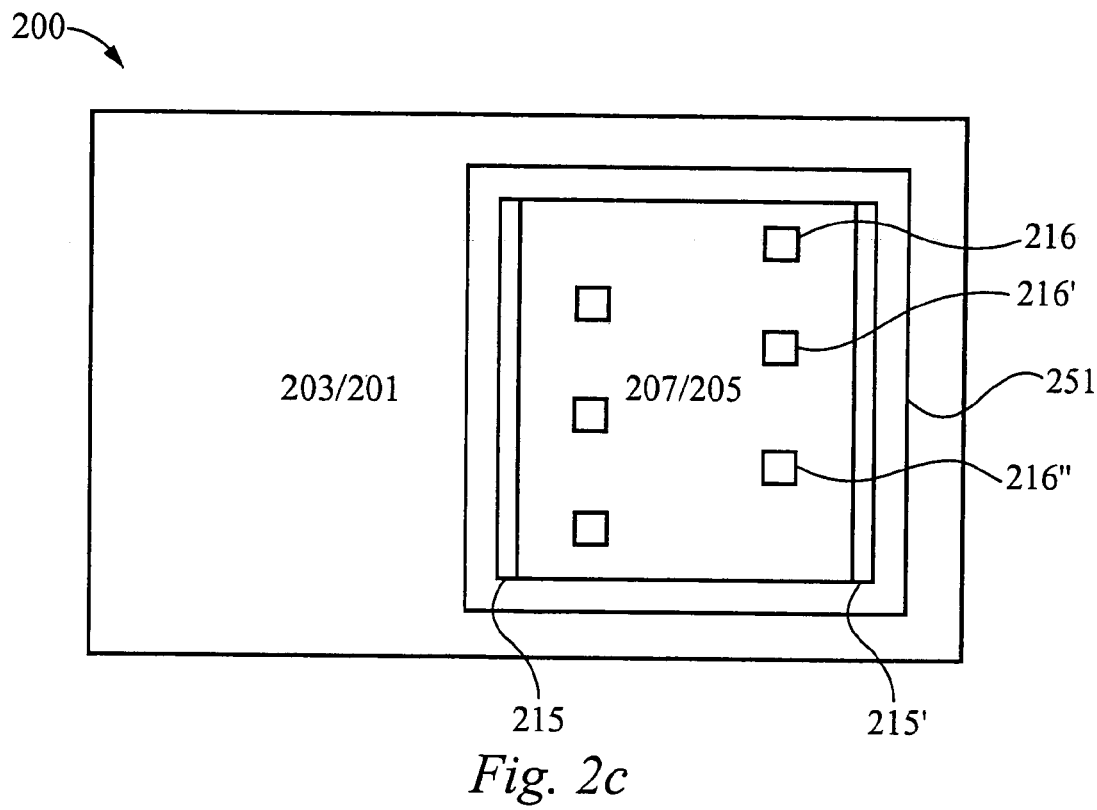

Referring now to FIG. 2c, a second etch-stop layer 207 is formed over the first sacrificial layer 205. The second etch-stop layer 207 can be formed of the same or different material as the first etch-stop layer 203. The second etch-stop layer 207 preferably comprises silicon oxide, a silicon nitride, a combination thereof or any other suitable material which exhibits sufficient resistance to the etchant used. In an embodiment of the invention, the first sacrificial layer 205 is etched prior to depositing the second etch-stop layer 207 to provide raised support features 215 and 215' which support the subsequently formed release structures. Alternatively, or in addition to forming the raised support features 215 and 215', support posts may be formed 216, 216' and 216" in positions to provide support for the release structures formed in subsequent steps. Preferably, the support posts 216, 216' and 216" are formed from an etch resistant material(s) that are the same or different than material(s) used to form the etch-stop layer 203 and/or etch-stop layer 207 and capping layer 211, as described in detail below.

Figure 2D:
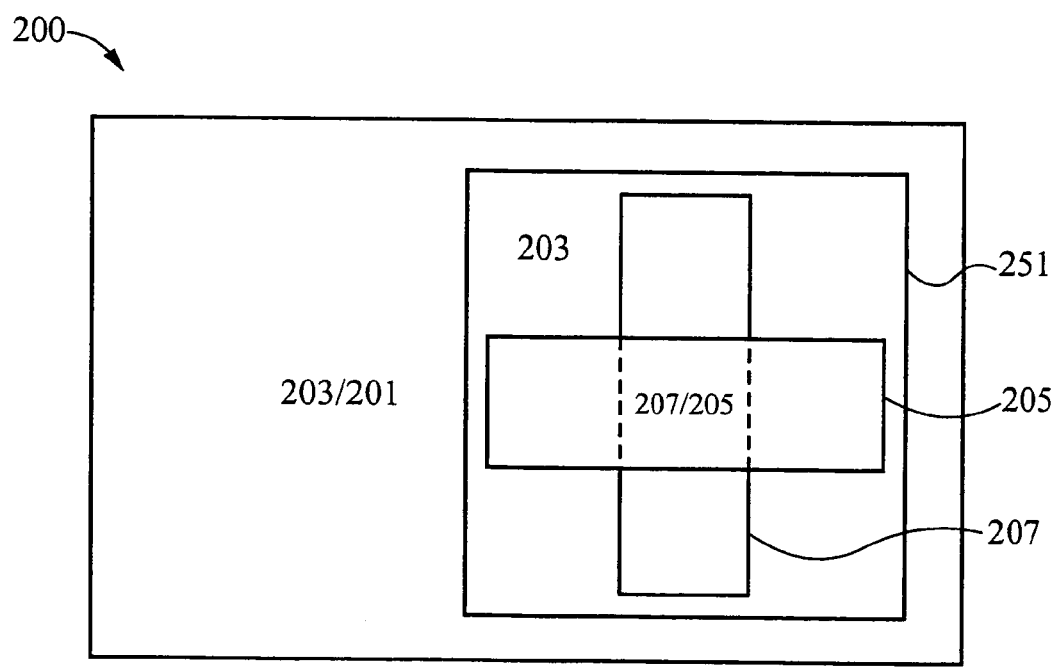

Alternatively to forming support features 215 and 215' and/or support posts 216, 216' and 216", or in addition to forming the support features 215 and 215' and/or support posts 216, 216' and 216", the second etch-stop layer 207 can be deposited in an area of the region 251 without underlying sacrificial layer 205 and such portions of the second etch-stop layer 207 maybe deposited directly onto and/or attached to the first etch-stop layer 203 and/or substrate 201, such as shown in FIG. 2d. After the second etch-stop layer 207 is patterned and the sacrificial layer 205 is etched, portions of the second etch-stop layer 207 deposited directly on the first etch-stop layer 203 provide structural supports for the release structures formed. There are any number of mechanisms to provide physical support for the release structures formed from the second etch-stop layer 207 that are considered to be within the scope of the instant invention.

Figure 2E:
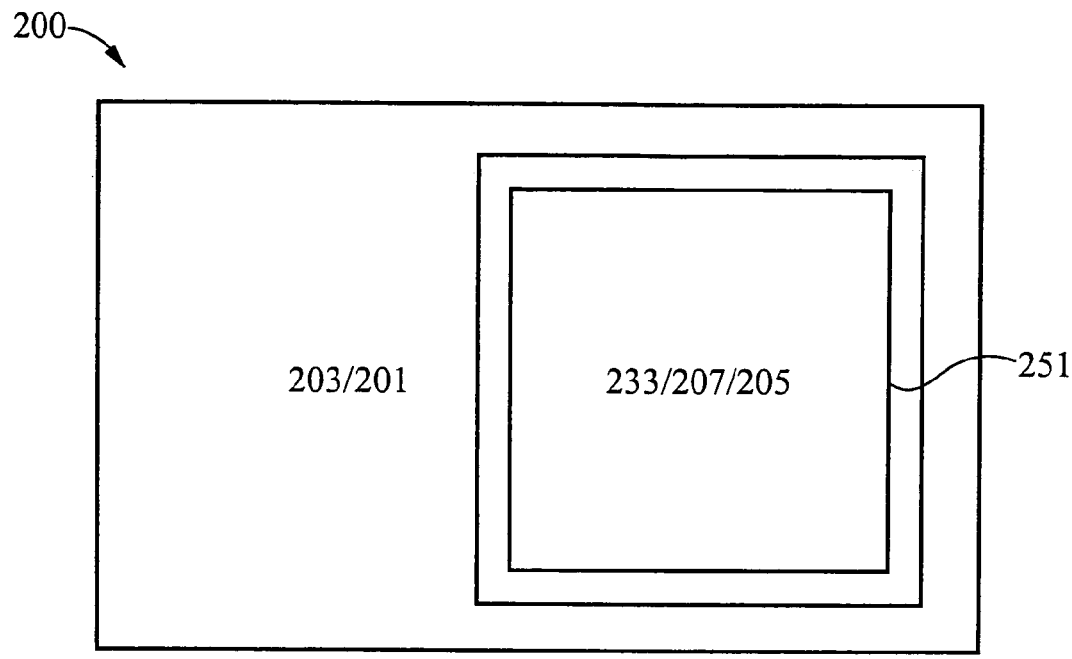
Figure 2F:
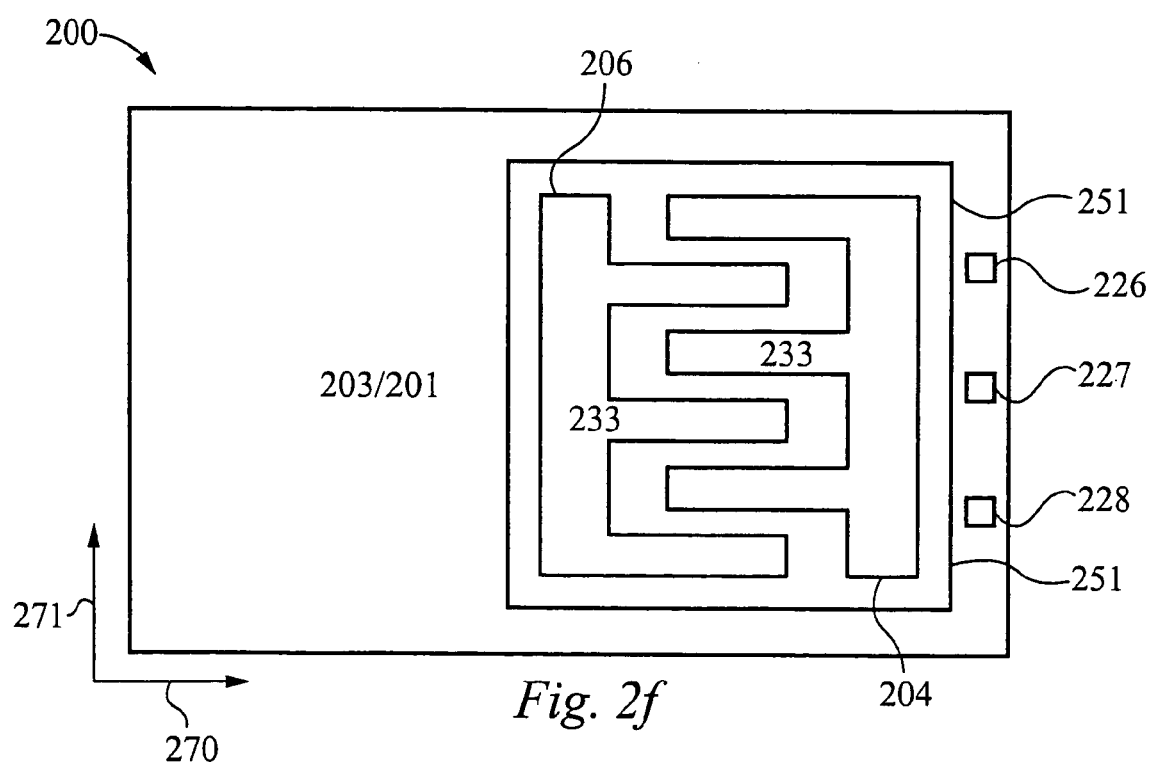

Now referring to FIG. 2e, in accordance with a preferred embodiment of the instant invention, a reflective layer 233 is deposited over the second etch-stop layer 207 and/or the support features 215 and 215' and/or support posts 216, 216' and 216". The reflective layer 233 preferably comprises aluminum or other suitable reflective material. The reflective layer 233 is preferably resistant to the enchant being used in removing the sacrificial layers, but which is capable of being etched using other suitable techniques including photo-lithography and plasma etch, wherein the patterned release structures formed in subsequent steps have reflective surfaces suitable for optical applications. Preferably, a set of bond pad 226, 227 and 228, such as shown in FIG. 2f, are also formed on the wafer structure 200 for electrically coupling the release structure(s) to a circuit external to the integrated circuit containing/comprising the release structure(s). It will be readily understood by those of ordinary skill in the art that the reflective layer 233 can alternatively be deposited on the release features 204 and 206 after they are formed.

Now referring to FIG. 2f, the reflective layer 233 and the second etch-stop layer 207 is patterned to form the release structures/features 204 and 206. The reflective layer 233 and the second etch-stop layer 207 are preferably patterned using conventional photo-lithography techniques and/or steps. For example, a photo-resist layer is formed on the reflective layer 233. The photo-resist is patterned and developed to form a patterned photo-resist mask (not shown). Portions of the reflective layer 233 and the second etch-stop layer 207 are then removed using conventional techniques leaving the patterned features 204 and 206 with a reflective layer 233 under the patterned photo-resist mask. The patterned photo-resist mask can then be removed from the patterned features 204 and 206 and the patterned features 204 and 206 can be encapsulated as described in detail below.

Alternatively, the first sacrificial layer 205 can be etched with a positive impression of the release features (not shown). The positive impression of the release features then provide nuclei for rapid anisotropic growth of release structure features 204 and 206. The first sacrificial layer 205 and/or the second etch-stop layer 207 can be cleaned or planarized prior to depositing the subsequent layers.

While the release features 204 and 206 are shown in FIG. 2f as comb structures, it is clear that the release features can be comb structures, ribbon structures, cantilevers or any number of other structures including, but not limited to, domain separators, support structures and/or cavity walls, such as described in detail below. Further, while providing a reflective layer 233 is preferred, the additional step of forming a reflective layer 233 is not required when the patterned features 204 and 206 are not used to reflect light, such as in the case for micro-fluidic devices. The line 270 shows an x-axis of the wafer structure 200 and the line 271 shows the y-axis of the wafer structure. The z-axis 272 of the wafer structure 272 in FIG. 2f is normal to the view shown.

Figure 2G:
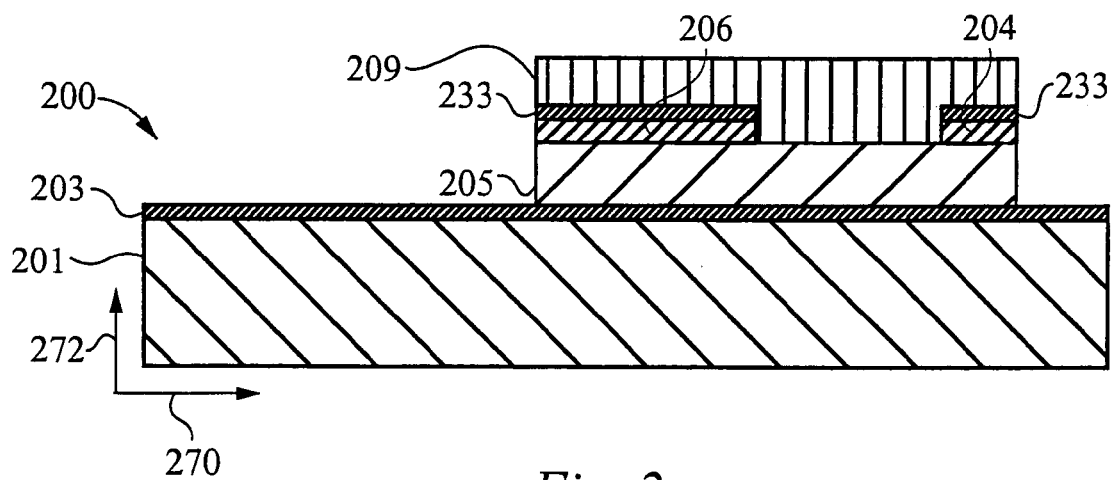

FIG. 2g shows a side cross-sectional view of the wafer structure 200 after a second sacrificial layer 209 is deposited over release features 204 and 206 with the reflective layer 233. In the FIG. 2g, the y-axis 271 is now normal to the view shown and the z-axis 272 in now in the plane of the view shown. The release features 204 and 206 are embedded between the sacrificial layers 205 and 209 and the sacrificial layers 205 and 209 are preferably in contact through gap regions between the release features 204 and 206. The second sacrificial layer 209 is formed of any suitable material that is selectively etched relative to the etch-stop layer(s) used to form the release structure device, but preferably comprises poly-silicon.

Figure 2H:
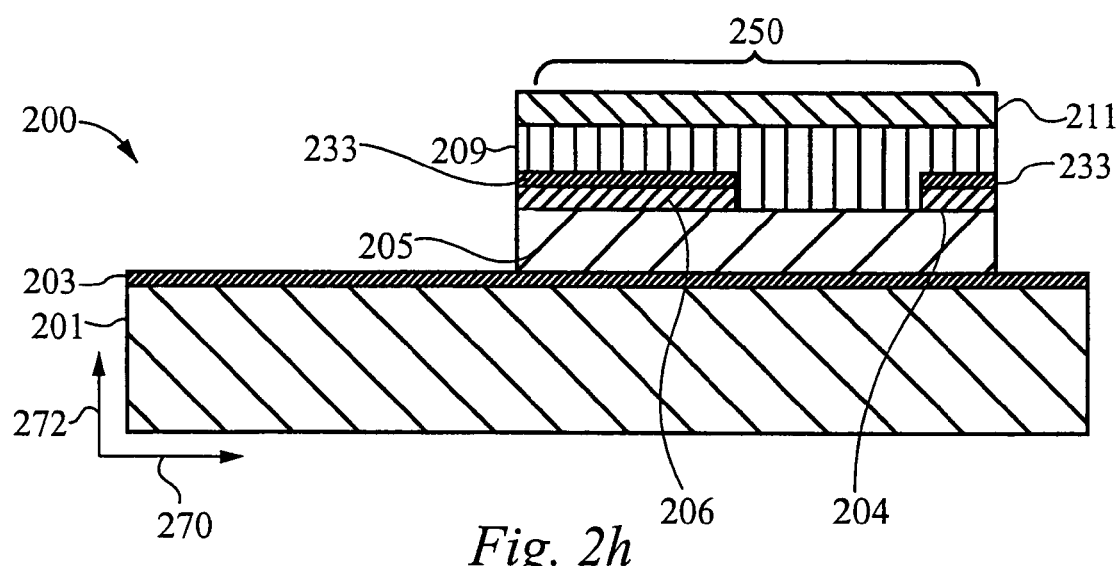

Now referring to FIG. 2h, after the second sacrificial layer 209 is deposited over the release features 204 and 206, a capping layer or capping structure 211 is deposited or formed over the second sacrificial layer 209. The capping layer 211 preferably comprises silicon oxide, silicon nitride any combination thereof or any other suitable material(s) which exhibit(s) sufficient resistance to the etchant used. The capping layer 211 can be formed of the same or different material as the first etch-stop layer 203 and/or the second etch-stop layer 207. FIGS. 3a–3f will now be used to illustrate the preferred method of forming an encapsulated release structure from a portion 250 of the structure 200 as shown in FIG. 2h.

Figure 3A:
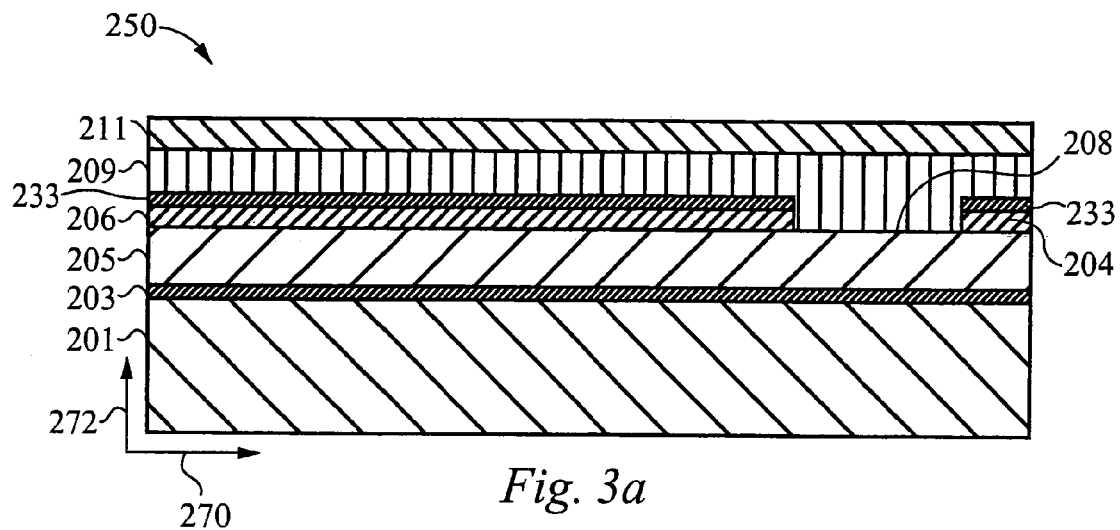
FIGS. 3a–f show cross-sectional views of release features being formed from a multi-layer structure, in accordance with a preferred method of the current invention.

Referring now to FIG. 3a, a device with a release structure, such as the MEMS resonators structure 102 shown in FIG. 1, or grating light valve™ light modulator structures, such as described above, are preferably made from a multi-layer structure 250. The multi-layer structure 250 has a first etch-stop layer 203 that is preferably formed on the region 251 of the silicon wafer substrate 201, such as previously described. The first etch-stop layer 203 may comprise any material or materials that exhibit resistance to etching under the conditions for etching the first sacrificial layer. For example, as when the first sacrificial layer comprises poly-silicon, the first sacrificial layer etchant comprises $XeF_2$, and the first sacrificial layer etching conditions that are described below for etching poly-silicon with $XeF_2$. The first etch-stop layer 203 preferably comprises a silicon oxide layer or a silicon nitride layer with a layer thickness in a range of 500 to 5000 Angstroms.

On top of the first etch-stop layer 203 there is formed a first sacrificial layer 205. The first sacrificial layer 205 may comprise any materials(s) that may be selectively etched relative to the underlying first etch-stop layer 203 (when present) or substrate 201 (when the first etch-stop layer is not present). However, when the first etch-stop layer 203 comprises silicon oxide or silicon nitride, the first sacrificial layer 205 preferably comprises a poly-silicon. Alternatively, the first sacrificial layer 205 can comprise a doped silicon oxide layer that is doped with boron, phosphorus or any other dopant which renders the first sacrificial layer 205 to be preferentially etched at an etch rate of 50:1 or greater over the substrate 201 or etch-stop layers 203 and 207 the substrate 201 and capping layer 211, described in detail below. The first sacrificial layer 205 preferably has a layer thickness in a range of 0.1 to 3.0 microns and is preferably etched under conditions to produce a 50 percent over-etch or greater for the sacrificial layers 205 and 207.

On top of the first sacrificial layer 205 is formed a second etch-stop layer 207. The second etch-stop layer 207 is patterned with features 206 and 204 corresponding to the release structure. The first etch-stop layer 203 may comprise any material(s) that exhibit resistance to etching under the conditions for etching the first sacrificial layer. For example, when the first sacrificial layer 205 comprises poly-silicon, the first sacrificial layer etchant comprises $XeF_2$, and the first sacrificial layer etching conditions are described below for etching poly-silicon with $XeF_2$. The second etch-stop layer 207 preferably comprises a silicon oxide layer or a silicon nitride layer with a layer thickness in a range of 300 to 5000 Angstroms.

On the second etch-stop layer 207 is formed a second sacrificial layer 209. The second sacrificial layer 209 may comprise any materials(s) that may be selectively etched relative to the underlying, the second etch-stop layer 207 and/or the first etch stop layer 203 (when present) or substrate (when the first etch-stop layer is not present). However, when the first and the second etch-stop layers 203 and 207 comprise silicon oxide or silicon nitride, the second sacrificial 209 layer preferably comprises a poly-silicon. Alternatively, second first sacrificial layer 209 can comprise a doped silicon oxide layer that is doped with boron, phosphorus or any other dopant which renders the sacrificial layer 209 to be preferentially etched at an etch rate of 50:1 or greater over the etch-stop layers 203 and 207, the substrate 201 and the capping layer 211, described below. The second sacrificial layer 209 preferably has a layer thickness in a range of 0.1 to 3.0 microns and preferably, the sacrificial layers 205 and 209 are in contact with each other in the patterned regions 208 or gaps between the features 206 and 204 of the release structure.

A capping or sealant layer 211 is deposited over second sacrificial layer 209. The capping or sealant layer 211 preferably comprises a conventional passivation material (e.g. an oxide, nitride, and/or an oxynitride of silicon, aluminum and/or titanium). The capping or sealant layer 211 also can comprise a silicon or aluminum-based passivation layer which is doped with a conventional dopant such as boron and/or phosphorus. More preferably, the capping layer or sealant layer 211 comprises a silicon oxide layer with a layer thickness in a range of 1.0 to 3.0 microns. It will be apparent to one of ordinary skill in the art that though the layers referred to above are preferably recited as being single layer structures, each can be formed of a sandwich of known layers to achieve the same result. Furthermore, though the layers are preferably taught as being formed one on top of the next, it will be apparent that intervening layers of varying thicknesses can be inserted.

Figure 3B:
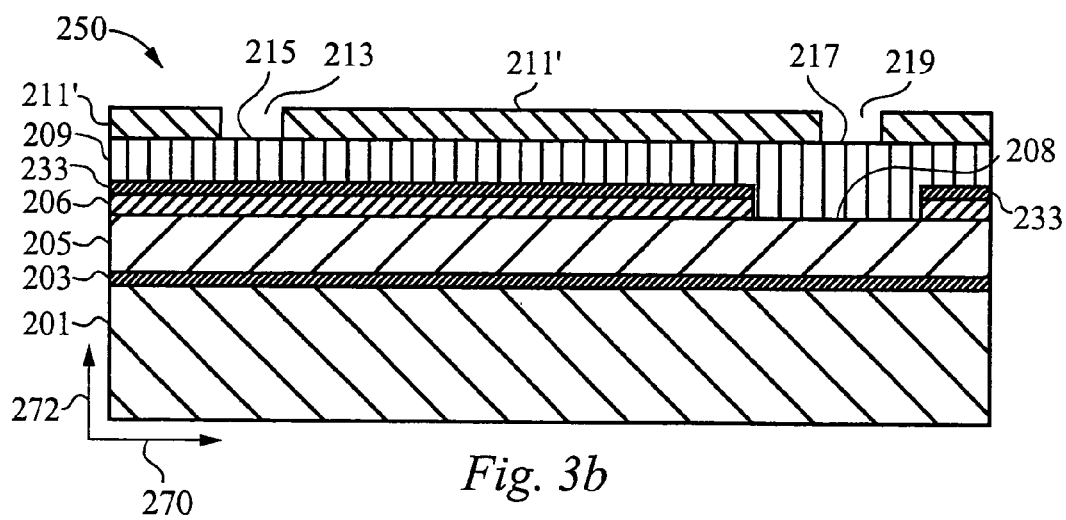

Now referring to FIG. 3b, access trenches 213 and 219 are formed in the capping layer 211 thereby exposing regions 215 and 217 of the second sacrificial layer 209. The access trenches 213 and 219 are preferably anisotropically etched, although the access trenches 213 and 219 may be formed by any number of methods including wet and/or dry etching processes. For example, a photo-resist is provided on the capping layer and is then exposed and developed to provide a pattern for anisotropically etching the access trenches 213 and 219. Alternatively, an etchant may be selectively applied to a portion of the etch-stop layer 211 corresponding to the access trenches 213 and 219. For example micro-droplets or thin streams of a suitable etchant can be controllably applied to the surface of the capping or sealant layer 211 using a micro-syringe technique, such as described by Dongsung Hong, in U.S. Patent Application No. 60/141,444, filed Jun. 29, 1999, the contents of which are hereby incorporated by reference.

After the access trenches 213 and 219 are formed in the capping layer 211, the capping layer can be treated or cleaned with a solvent such as N-methyl-2-pyrolidone (NMP) in order to remove residual photo-resist polymer. Also, when the second sacrificial layer comprises poly-silicon, the exposed regions 215 and 217 of the second sacrificial layer 209 can be treated with a pre-etch solution of ethylene glycol and ammonium fluoride. A suitable pre-mixed solution of ethylene glycol and ammonium fluoride is commercially available under the name of NOE Etch I™ manufactured by ACSI, Inc., Milpitas, Calif. 95035. Oxides can form on the surfaces of exposed poly-silicon regions, such as 215 and 217. Such oxides can interfere with poly-silicon etching and result in an incomplete etch. The pre-etch solution is believed to prevent and/or inhibit the formation of oxides on the surfaces of the exposed regions 215 and 217, or removes such oxides if present and/or formed, to avoid incomplete etching of the sacrificial layers 205 and 209.

Figure 3C:
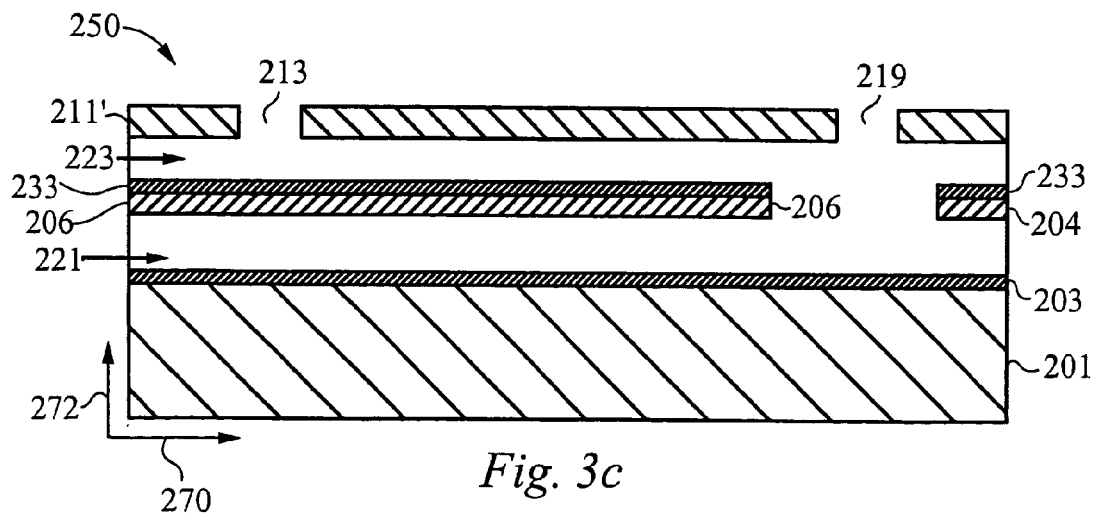

Now referring to FIG. 3c, after the access trenches 213 and 219 are formed in the capping layer 211, the sacrificial layers 205 and 209 are selectively etched to release the features 204 and 206. The features 204 and 206 can have any number of different geometries. For example, in the fabrication of a MEMS device the release features are comb or ribbon structures. In the fabrication of a micro-fluidic device the release features provide pathways which interconnect cavities 221 and 223. In the fabrication of electronic levels or electronic accelerometers the release features can be cantilevers. After the features 204 and 206 are released, then the access trenches 213 and 219 in the layer 211' are sealed to encapsulate the features 204 and 206 between the layers 203 and 211'.

Figure 3D:
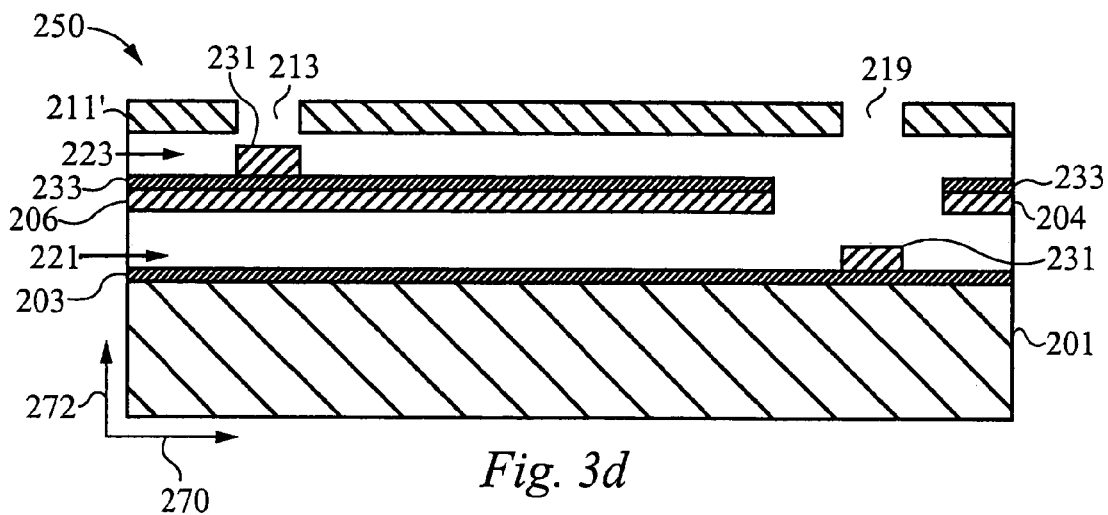

Now referring to FIG. 3d, in further embodiments of the instant invention, prior to sealing the access trenches 213 and 219 in the layer 211', a gettering material 231 such as titanium or a titanium-based alloy can be deposited within at least one of structure cavities 221 and 223 through the access trenches 213 and 219. Alternatively, gettering material/agent 231 can be deposited at the time that the reflective layer 233 is formed. In yet further embodiments, a gettering material 231 is a dopant within one or more of the sacrificial layers 205 and 209 that is released during the etching of the sacrificial layers 205 and 209.

Figure 3E:
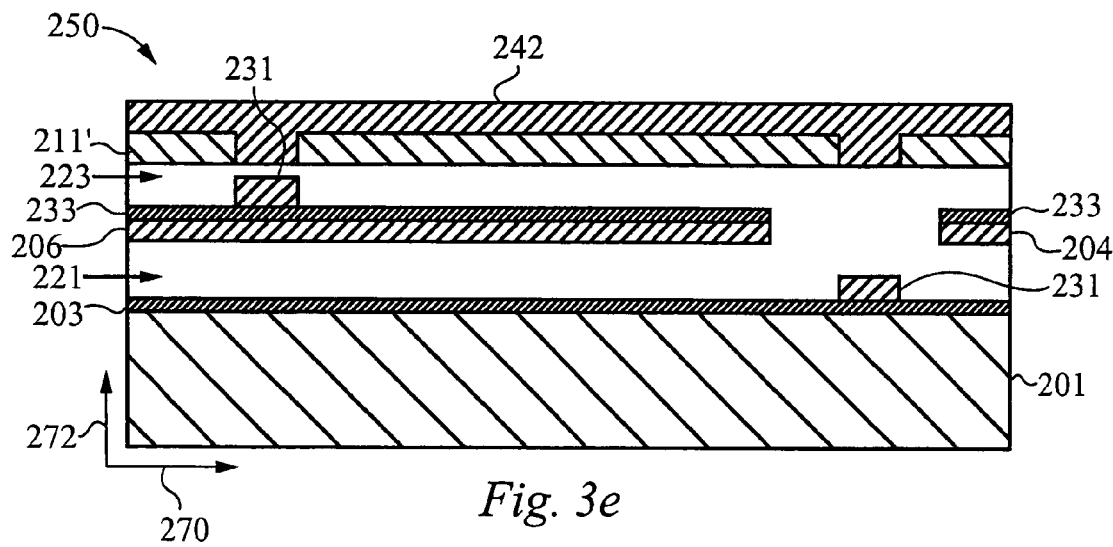

Now referring to FIG. 3e, after surfaces of the cavities 221 and 223 and/or the features 204 and 206 are treated and provided with a suitable environment, as described in detail below, the access trenches 213 and 219 are preferably sealed. The release features 204 and 206 are preferably sealed under a vacuum, but can be sealed within a predetermined or controlled gas and/or liquid environments for some applications. The access trenches 213 and 219 are sealed by any of a number of methods and using any of a number of materials including metals, polymers and/or resins. Preferably, the access trenches 213 and 219 are sealed by sputtering a conventionally sputtered metal or metals over the access trenches 213 and 219 and the capping layer 211 and more preferably by sputtering aluminum over the access trenches 213 and 219 and capping layer to form a layer 242.

Figure 3F:
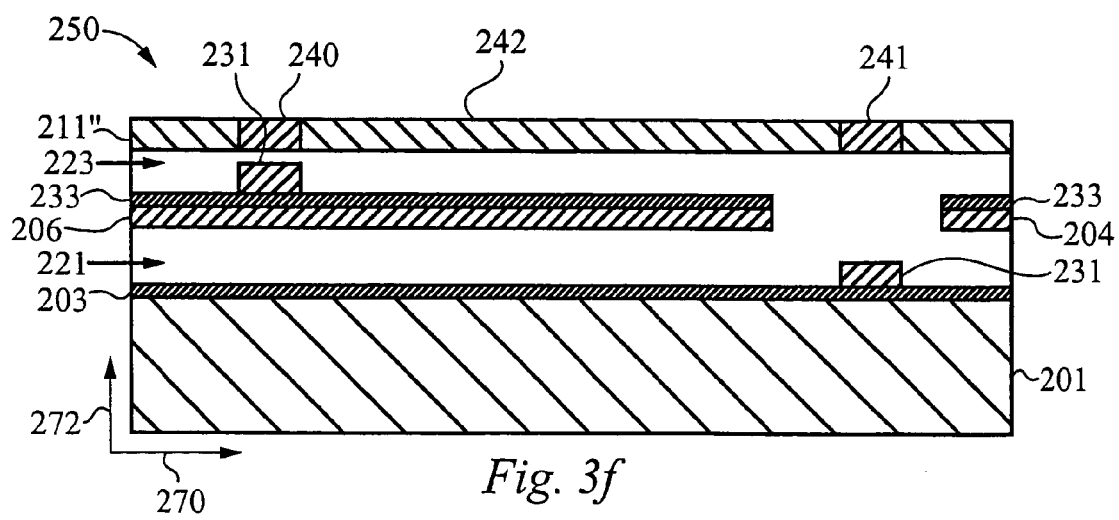

Now referring to FIG. 3f, for optical applications, a portions of the layer 242 can be removed such that corking structures 240 and 241 remain in the access trenches 213 and 219. The capping layer or structure 211 may provide an optical window through which light can pass to the layer 233 on the release features 204 and 206. Portions of the layer 242 are preferably removed by micro-polishing techniques. Alternatively, conventional photo-lithography techniques can be used to etch away a portion of layer 242.

In an embodiment of the invention, portions of the layer 242 of the layer can be selectively removed such that the capping layer 211 provides an optical aperture (not shown) through which light can pass to and/or from the layer 233 on the release features 204 and 206.

Figure 4:
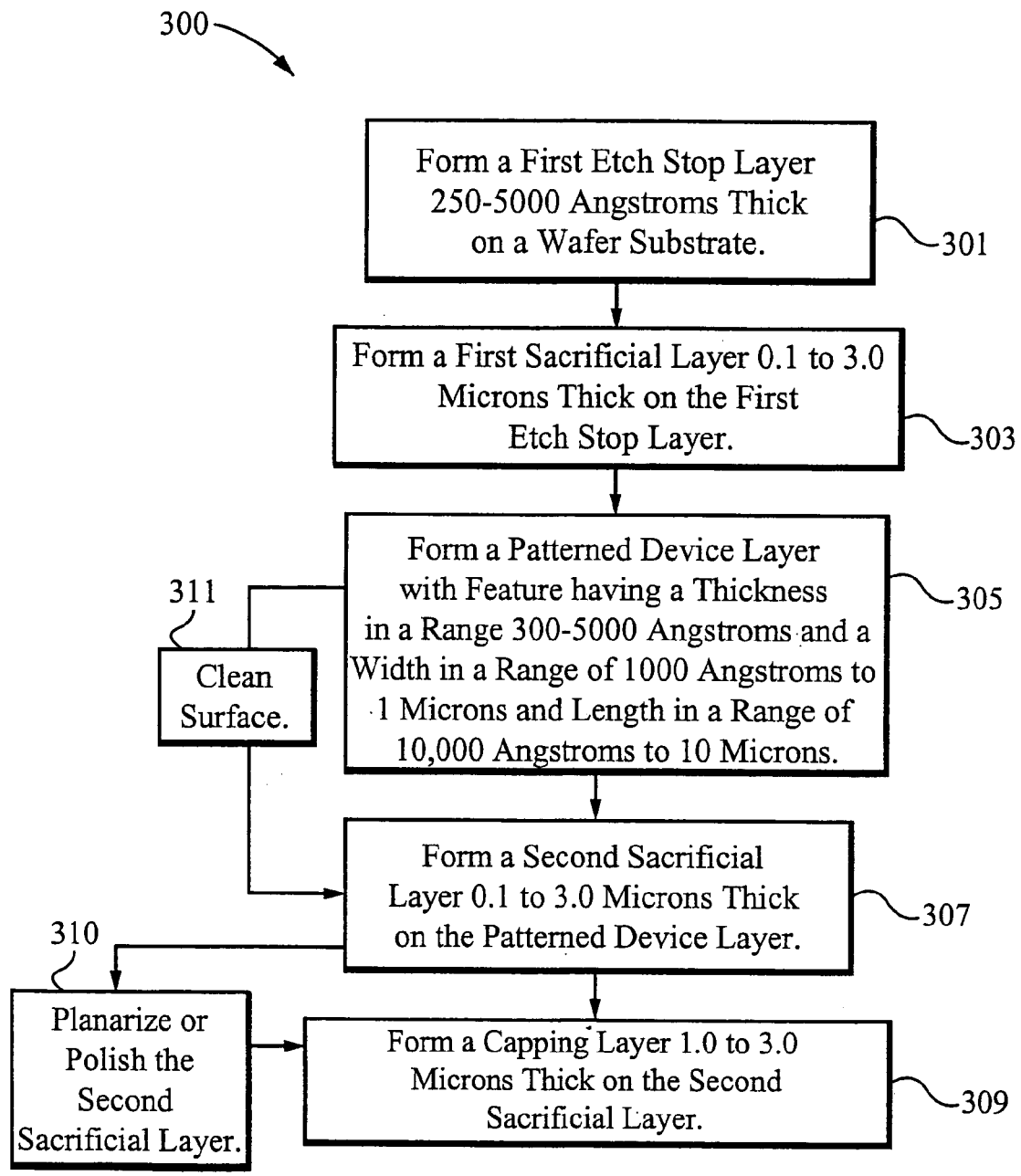

FIG. 4 is a block diagram flow chart 300 outlining steps for forming a multi-layer structure, such as shown in FIG. 3a and in accordance with a preferred method of the instant invention. For example, the multi-layer structure shown in FIG. 3a can be made by sequential deposition processes, such as described above, wherein the uniformity and thicknesses of each of the structure layers are readily controlled.

Still referring to FIG. 4, in the step 301, a silicon dioxide layer is formed by steam or dry thermal growth on a silicon substrate or by deposition on a selected region of the silicon wafer or other suitable substrate. Preferably, the silicon dioxide layer is thermally grown to a thickness in a range of 250 to 5000 Angstroms and more preferably in a range of 250 to 750 Angstroms. The thermal oxidation occurs by placing the wafer substrate at a temperature in a range of 600 to 800 degrees Celsius in a controlled oxygen environment. In the step 303, a poly-silicon layer is preferably deposited by Low Pressure Chemical Vapor Deposition (LPCVD) on the first etch stop layer to a thickness in a range of 0.1 to 3.0 microns and more preferably to a thickness in a range of 0.5 to 1.0 microns. Low Pressure Chemical Vapor Deposition of the amorphous poly-silicon is preferably carried out at temperatures in a range of 450 to 550 degrees Celsius.

After the first poly-silicon layer is deposited in the step 303, then in the step 305 a silicon nitride device layer is formed on the first poly silicon sacrificial layer. Preferably, the silicon nitride layer is formed by LPCVD to a thicknesses in a range of 300 to 5000 Angstroms and more preferably in a range of 750 to 1250 Angstroms. The silicon nitride device layer can be formed by thermal decomposition of dichlorosilane in the presence of ammonia.

In accordance with alternative embodiment of the current invention, the silicon nitride layer is patterned with structure features after depositing a photo-resist layer, the photo-resist is the exposed and developed (thereby forming an etch mask). Alternatively, a pattern is selectively etched into the first poly-silicon layer formed in the step 303 to initiate rapid growth of the subsequently deposited silicon nitride layer in the etched areas of the poly-silicon layer. Preferably, however, the silicon nitride layer is deposited as a continuous layer which is then selectively etched to form the release features of the release structure using a conventional photo-resist mask, as described above.

After forming the patterned silicon nitride layer in the step 305, then in the step 307 a second sacrificial layer is formed over the patterned silicon nitride layer, sandwiching or embedding the patterned layer between the first and the second sacrificial layers. The second sacrificial layer is preferably also a poly-silicon layer that is preferably deposited by LPCVD to a thickness in a range of 0.1 to 3.0 microns and more preferably to a thickness in a range of 0.5 to 1.0 microns. The second sacrificial layer is preferably formed by thermal decomposition of an silicon containing reagent, such as previously described. Preferably, the first and the second poly-silicon layers have contact points whereby an etchant can pass through the contact points between the first and the second sacrificial layers to etch away portions of both the first and the second poly-silicon sacrificial layers. Preferably, in the step 311, and prior to the step 305 of forming the second poly-silicon layer, the deposition surface of the patterned silicon nitride layer is treated with a solvent such NMP (which can be heated) to clean its surface and remove residual residue or polymer formed during the masking steps. In accordance with the method of the current invention, surfaces can be treated at any time during the formation of the multi-layer structure to remove residues thereon that may lead to poor quality films.

After the second poly-silicon layer is formed in the step 307, then in the step 309, a capping layer is formed over the second poly-silicon layer. The capping layer is preferably a silicon dioxide capping layer deposited by Plasma Enhanced Chemical Vapor deposition (PECVD) to a thickness in a range or 1.0 to 3.0 microns and more preferably in a range of 1.5 to 2.0 microns. In the PECVD process, an organo-silicon compound, such as a tetraethyl orthosilicate (TEOS), is decomposed in the presence of an oxygen source, such as molecular oxygen, to form the silicon oxide capping layer. In the step 310, and prior to the step 309, the second poly-silicon layer may be planarized and/or cleaned to prepare a suitable deposition surface for depositing or forming the capping layer.

Figure 5:
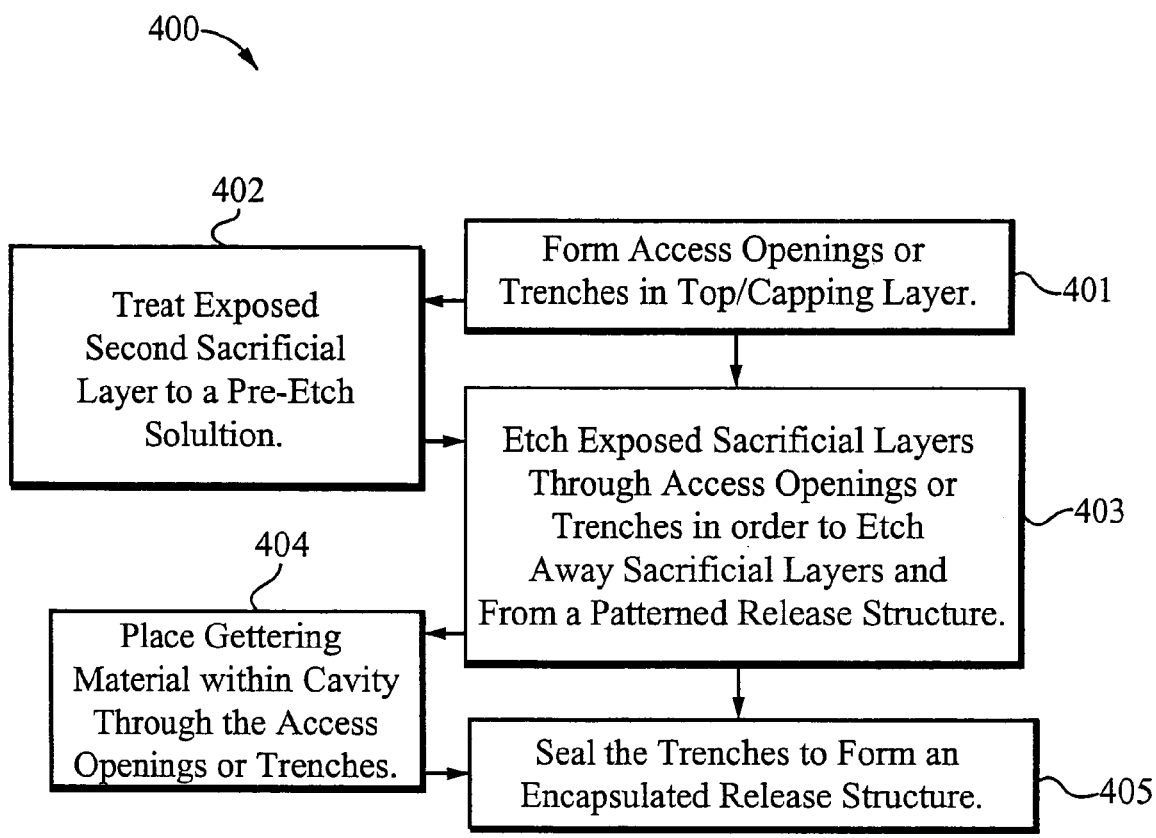

FIG. 5 is a block diagram flow chart 400 outlining the preferred method of forming a device from a multi-layered structure, such as shown in FIG. 3a. In the step 401, access trenches are formed in the capping layer. The access trenches are formed with diameters in a range of 0.4 to 1.5 microns and more preferably in a range of 0.6 to 0.8 microns. The access trenches are preferably formed in the silicon oxide capping layer using a reactive ion etch process. The reactive ion etch process can, under known or empirically determined conditions, etch trenches with sloped or straight walls which can be sealed in a subsequent step or steps. The access trenches are preferably formed through the capping layer to exposed regions of the sacrificial material therebelow. Preferably, in step 402, and prior to the step 403, the exposed regions of the sacrificial layer are treated with a pre-etch cleaning solution of ethylene glycol and ammonium fluoride, that comprises approximately a 10% by weight solution of ammonium fluoride dissolved in ethylene glycol. After the exposed regions of the sacrificial layer are treated with the pre-etch solution in the step 402, then in the step 403 the poly-silicon layers are selectively etched with an etchant comprising a noble gas fluoride $NgF_{2x}$, (wherein Ng=Xe, Kr or Ar, and where x=1, 2 or 3). More preferably, the etchant comprises xenon difluoride. Further advantages of using xenon difluoride etchant are described by Pister in U.S. Pat. No. 5,726,480, the contents of which are hereby incorporated by reference.

After the etching step 403 is complete, then in the step 404 a gettering material can be deposited through one or more of the access trenches into the device cavity formed during the etching step 403. In the step 405, the access trenches are preferably sealed by sputtering aluminum onto the capping layer in a sufficient quantity to seal the access trenches. Excess aluminum can be removed from the capping layer by well known methods such as chemical, mechanical polishing or phot-lithography.

Figure 6:
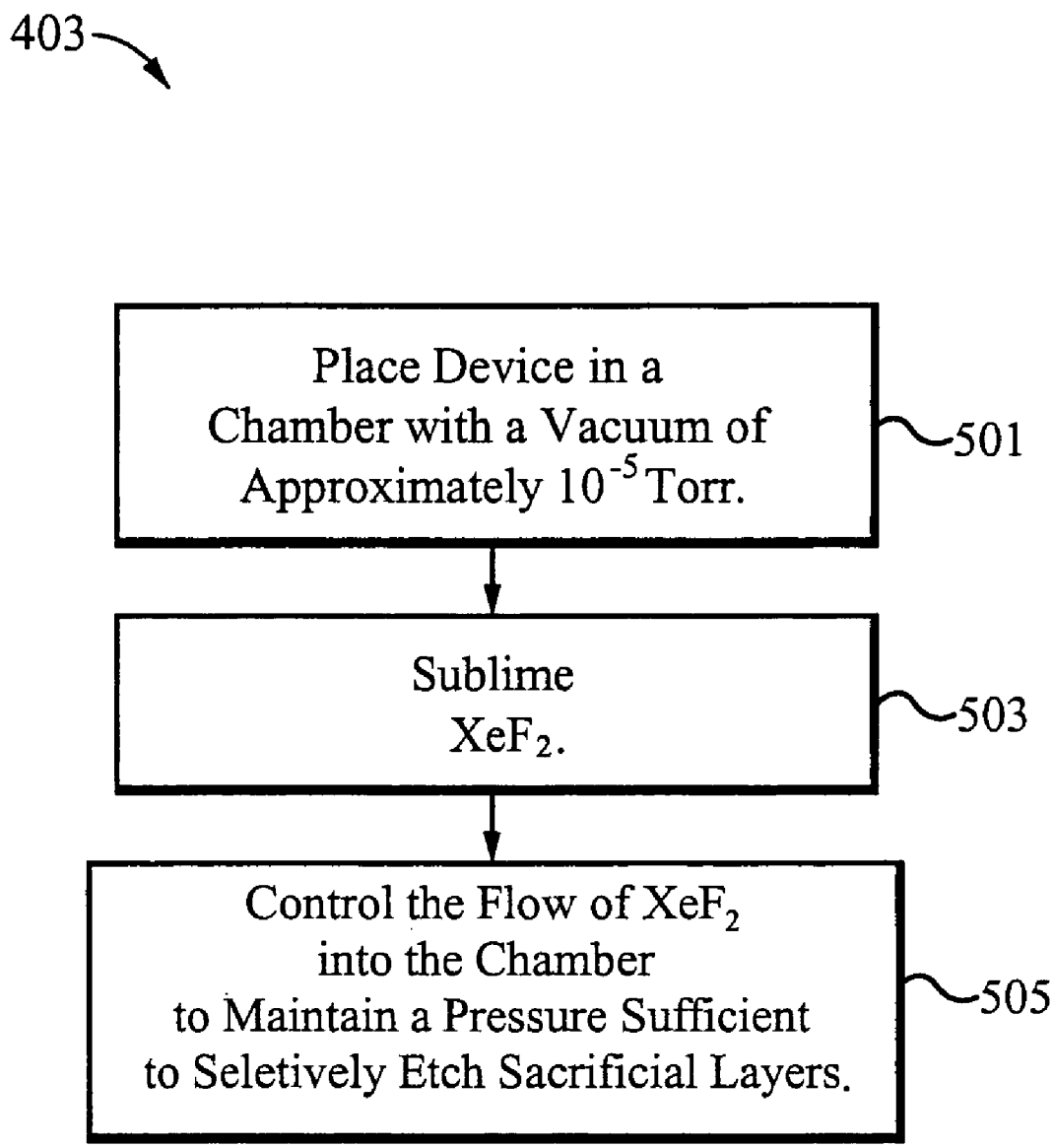
FIG. 6 is a block-diagram outlining the method of etching sacrificial layers of the multi-layer structure, such as illustrated in FIG. 2b.

FIG. 6 is a block diagram outlining the preferred method of etching the poly-silicon sacrificial layers in the step 403 shown in FIG. 5. After the access trenches are formed in the step 401, and the exposed regions of the poly-silicon layer are treated in the step 402, as described above, then in the step 501, the structure is place under a vacuum, wherein the partial pressure of water that is preferably $5 \times 10^{-4}$ Torr or less. In the step 503, xenon difluoride crystals are preferably sublimed at a pressure in a range of 0.1 to 100 Torr, more preferably in a range of 0.5 to 20 Torr and most preferably at approximately 4.0 Torr. In the step 505, a controlled stream of xenon difluoride is provided to the chamber, which is preferably a chamber of a cluster tool equipped with a load lock for transferring the device in and out of the chamber and/or between processing chamber within the cluster tool. The chamber is preferably maintained at a pressure lower than the sublimation pressure of the xenon difluoride crystals to ensures a positive flow of the xenon difluoride to the chamber. The pressure in the chamber is preferably maintained in a range of 0.1 milliTorr to 10.0 Torr, more preferably in a range of 1.0 milliTorr to 100 milliTorr and most preferably at approximately in a range of 60 to 80 milliTorr (0.06–0.08 Torr) during the etching steps.

Figure 7:
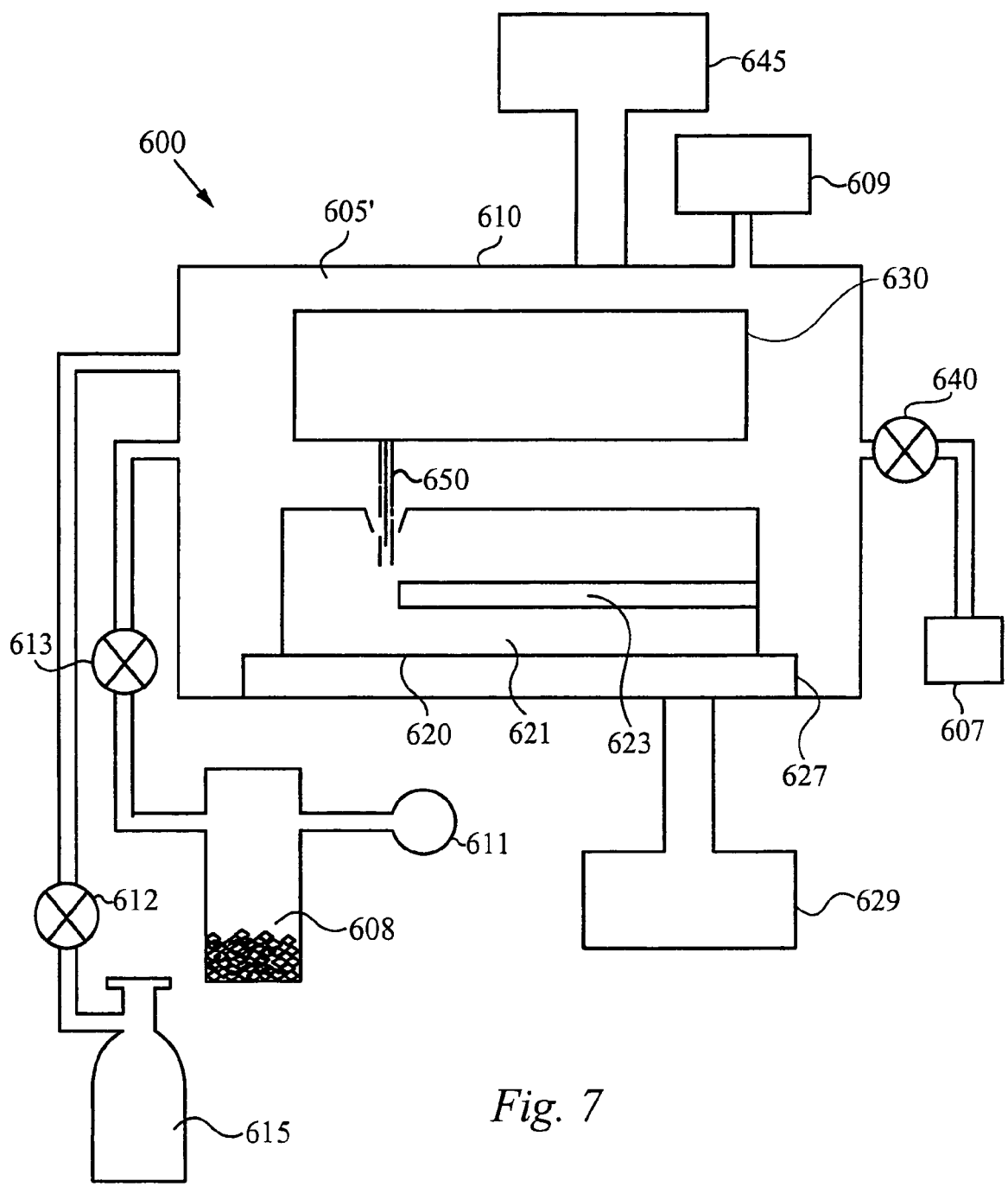
FIG. 7 is a schematic diagram of a chamber apparatus or processing station configured to etch a multi-layered structure, formed in accordance with the method of instant invention.

FIG. 7 illustrates a schematic representation of an etching station 600 in cluster tool for carrying out the etching step described above. The etching station 600 is preferably couple to a load lock 645 for transferring the device 620 in and out of the chamber environment 605' and/or between processing stations within the cluster tool. The etching station 600 is preferably coupled with a vacuum source 607 that is capable of drawing a vacuum in the chamber environment 605'. The etching station 600 preferably includes a pressure measuring device 609 that allows a user to monitor the pressure within the chamber 610. A container 608 containing an etchant source (e.g. crystals of xenon difluoride) is coupled to the chamber 610 through a pressure or flow controller 613. The container 608 can have a pressure measuring device 611 coupled to the container 608 to allow the user to monitor the pressure within the container 608.

In operation, a multi-layer structure 620, similar to those described previously, is placed in the chamber 610. The vacuum control valve 640 is opened and the vacuum source 607 draws a vacuum reducing the pressure the partial pressure of water within the chamber 610 to $5.0 \times 10^{-4}$ Torr or less. It is important that the partial pressure of water within the chamber 610 remains at $5.0 \times 10^{-4}$ Torr or less during the etching steps in order to maintain a high degree of selectively during the etching step(s). Under known conditions, the xenon difluoride crystals at room temperature form a vapor pressure of $XeF_2$ of approximately 4.0 Torr, as determined by the pressure measuring device 611. The pressure controller 613 is adjusted to change the pressure of the chamber environment 6051 to be in a range or 60 to $80 \times 10^{-3}$ Torr. The structure 620 is etched for a time sufficient it form the release within the cavity 621 of the structure 620. The etching process can take place over a period of approximately 20–30 minutes, depending on the etching pressure chosen, the physical details of the structure 620 and flow dynamics of the chamber 610.

During the etching step, the device 621 is preferably cooled or maintained at a temperature of approximately 20 degrees Celsius, through heat sink 627. The heat sink 627 is preferably coupled to a cooling means 629, such as a refrigeration unit for controlling the temperature of the heat sink 627 at or below 20 degrees Celsius. The heat sink 627, is preferably formed from metal or another material suitable for absorbing heat from the device 621, while the device 621 is couple to the heat sink 627.

After the etching step is complete, a suitable sealing environment may then be provided. Accordingly, in one embodiment of the invention the patrial pressure control value 613 is shut off and a low pressure vacuum is reestablished using a draw from the vacuum source 607. The trenches of the etched structure 620 may be sealed by a sputter beam 650 of aluminum, using a sputter device 630.

Alternatively, after reestablishing a low pressure vacuum, the chamber may be backfilled with a noble gas. Accordingly, a noble gas source 615 may be coupled to the control chamber 610 through a control valve 612. The chamber environment 605' is flushed with a noble gas by opening the gas valve 612 prior to sealing the trenches of the device 620. The trenches of the device 620 may then be sealed with a polymer or ceramic material, thereby capturing a portion of the chamber environment 605' within the cavity 621 of the device 620.

The above examples have been described in detail to illustrate the preferred embodiments of the instant invention. It will be clear to one of ordinary skilled in the art that there are many variations to the invention that are within the scope of the invention. For example, a device with multiple layers of release structures can be formed by extending teachings of the invention and using multi-layer structures having more than one pattered layer. Further, it is clear that any number of devices with coupled and uncoupled release structures and with multi-cavity structures are capable of being fabricated using the method of the instant invention.

What is claimed is:

1. A method of making a spatial light modulator comprising:
    a. embedding a device layer comprising ribbon features in a sacrificial material;
    b. forming a capping structure with at least one access trench;
    c. etching the sacrificial material using an etchant comprising a noble gas fluoride through the at least one access trench to release the ribbon features from the sacrificial material, wherein a partial pressure of water is maintained at $5 \times 10^{-4}$ Torr or less during the etching of the sacrificial material and the device layer is cooled during the etching of the sacrificial material; and
    d. sealing the at least one access trench with a sealing material thereby encapsulating the ribbon features within a sealed cavity comprising a predetermined environment.

2. The method of claim 1, wherein embedding the device layer comprises:
    a. depositing a first layer of the sacrificial material on a substrate surface;
    b. forming the device layer over the first layer of sacrificial material; and
    c. depositing a second layer of the sacrificial material over the device layer.

3. The method of claim 2, wherein the substrate surface comprises a material selected from the group consisting of an oxide, an oxynitride, and a nitride of silicon.

4. The method of claim 1, wherein the device layer comprises a material selected from the group consisting of oxides, oxynitrides and nitrides of silicon.

5. The method of claim 1, wherein the capping structure comprises a material selected from the group consisting of oxides, oxynitrides, and nitrides of silicon.

6. The method of claim 1, wherein the sacrificial material comprises poly-silicon.

7. The method of claim 1, wherein forming the capping structure comprises:
   a. depositing a layer of capping material; and
   b. anisotropically etching the capping material to form the at least one access trench.

8. The method of claim 1, wherein the noble gas fluoride comprises xenon difluoride.

9. The method of claim 1, wherein the sacrificial material is selectively etched relative to the capping structure by a rate (mass/time) of greater than 50:1.

10. The method of claim 1, wherein the sealing material comprises a material selected from the group consisting of polymers, metals and ceramics.

11. The method of claim 1, further comprising treating the sacrificial material with ethylene glycol and ammonium fluoride through the at least one access trench prior to etching.

12. The method of claim 2, wherein forming the device layer comprises:
   a. depositing a silicon nitride-based layer on the first layer of the sacrificial material; and
   b. patterning the ribbon features into the silicon nitride-based layer.

13. The method of claim 12, wherein patterning the ribbon features into the silicon nitride-based layer comprises:
   a. forming a mask on the silicon nitride-based layer; and
   b. etching the ribbon features into the silicon nitride-based layer through the mask.

14. The method of claim 13, wherein the mask is formed of a photo-resist, the method further comprising cleaning the device layer with a solvent after etching the ribbon features into the silicon nitride-based layer.

15. The method of claim 14, wherein the solvent comprises N-methyl-2-pyrolipone.

* * * * *